(12) United States Patent
Zhang et al.

(10) Patent No.: US 12,707,843 B2
(45) Date of Patent: Aug. 11, 2026

(54) DISPLAY SUBSTRATE WITH PIXEL OPENING AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tiaomei Zhang, Beijing (CN); Haigang Qing, Beijing (CN); Zhenhua Zhang, Beijing (CN); Mengqi Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 574 days.

(21) Appl. No.: 18/021,882

(22) PCT Filed: Jan. 10, 2022

(86) PCT No.: PCT/CN2022/070991
§ 371 (c)(1),
(2) Date: Feb. 17, 2023

(87) PCT Pub. No.: WO2023/130440
PCT Pub. Date: Jul. 13, 2023

(65) Prior Publication Data

US 2024/0268172 A1 Aug. 8, 2024

(51) Int. Cl.
*H10K 59/131* (2023.01)
*H10K 59/121* (2023.01)
*H10K 59/35* (2023.01)

(52) U.S. Cl.
CPC ..... *H10K 59/1315* (2023.02); *H10K 59/1213* (2023.02); *H10K 59/35* (2023.02)

(58) Field of Classification Search
CPC ........... H10K 59/1315; H10K 59/1213; H10K 59/35; H10K 59/131; G09G 3/3225
See application file for complete search history.

(56) References Cited

U.S. PATENT DOCUMENTS

2011/0157110 A1* 6/2011 Chou ................ H10K 59/1315 345/80
2013/0082288 A1 4/2013 Kim et al.
(Continued)

FOREIGN PATENT DOCUMENTS

CN 103035848 A 4/2013
CN 108565358 A 9/2018
(Continued)

OTHER PUBLICATIONS

International Search Report and Written Opinion for Application No. PCT/CN2022/070991, dated May 30, 2022, 9 Pages.

*Primary Examiner* — Chad M Dicke
*Assistant Examiner* — Jeremy Daniel Watts
(74) *Attorney, Agent, or Firm* — BROOKS KUSHMAN P.C.

(57) ABSTRACT

A display substrate and a display device are provided. The display substrate includes: a base substrate, a plurality of data lines arranged on the base substrate, and a plurality of first sub-pixels arranged on the base substrate; the first sub-pixel includes: a first pixel opening, an orthographic projection of the first pixel opening on the base substrate partially overlaps an orthographic projection of a target data line among the plurality of data lines on the base substrate; a planarization compensation pattern, at least part of the planarization compensation pattern extends along a first direction, an orthographic projection of the planarization
(Continued)

compensation pattern on the base substrate at least partially overlaps an orthographic projection of the first pixel opening on the base substrate, the planarization compensation pattern and the target data line are arranged along a second direction, and the second direction intersects the first direction.

19 Claims, 16 Drawing Sheets

(56) References Cited

U.S. PATENT DOCUMENTS

2018/0158895 A1* 6/2018 Lee .................... H10K 59/124
2018/0247988 A1* 8/2018 Lee .................... H10K 59/123
2019/0348491 A1* 11/2019 Chung ................ H10K 59/131
2020/0119126 A1* 4/2020 Jo ...................... H10D 86/441
2020/0144298 A1* 5/2020 Tao .................... H10D 86/411
2020/0212121 A1* 7/2020 Kang .................. H10K 59/32
2021/0126075 A1 4/2021 Wang et al.
2021/0159292 A1 5/2021 Zhang et al.
2021/0233955 A1 7/2021 Itou
2021/0335990 A1 10/2021 Chen et al.
2021/0358407 A1* 11/2021 Xu .................... H10K 59/1216
2022/0285458 A1 9/2022 Shang et al.
2022/0285474 A1* 9/2022 Kim .................. H10K 59/1315
2022/0320210 A1 10/2022 Tang
2024/0349561 A1* 10/2024 Zhang ............... H10K 59/1315

FOREIGN PATENT DOCUMENTS

CN 109860259 A 6/2019
CN 110021654 A 7/2019
CN 110047898 A 7/2019
CN 110429116 A 11/2019
CN 110459561 A 11/2019
CN 111584599 A 8/2020
CN 111987136 A 11/2020
CN 213212167 U 5/2021
CN 112952016 A 6/2021
CN 113078196 A 7/2021
JP 2021117357 A 8/2021

* cited by examiner

DISPLAY SUBSTRATE WITH PIXEL OPENING AND DISPLAY DEVICE

CROSS-REFERENCE TO RELATED APPLICATIONS

This application is the U.S. national phase of PCT Application No. PCT/CN2022/070991 filed on Jan. 10, 2022, which is incorporated herein by reference in its entirety.

TECHNICAL FIELD

The present disclosure relates to the field of display technology, in particular to a display substrate and a display device.

BACKGROUND

Organic Light-Emitting Diode (OLED) displays are widely used in various fields with the advantages of light, high brightness, low power consumption, fast response, high definition, good flexibility, and high light-emitting efficiency. As consumers continue to improve the requirements of display quality, the display gradually develops in the direction of high pixel density.

SUMMARY

An object of the present disclosure is to provide a display substrate and a display device.

In order to achieve the above-mentioned object, the present disclosure provides the following technical solutions.

In one aspect, the present disclosure provides in some embodiments a display substrate, including: a base substrate, a plurality of data lines arranged on the base substrate, and a plurality of first sub-pixels arranged on the base substrate; wherein the first sub-pixel includes: a first pixel opening, wherein an orthographic projection of the first pixel opening on the base substrate partially overlaps an orthographic projection of a target data line among the plurality of data lines on the base substrate; a planarization compensation pattern, wherein at least part of the planarization compensation pattern extends along a first direction, an orthographic projection of the planarization compensation pattern on the base substrate at least partially overlaps the orthographic projection of the first pixel opening on the base substrate, the planarization compensation pattern and the target data line are arranged along a second direction, and the second direction intersects the first direction.

Optionally, the first sub-pixel further includes a first sub-pixel driving circuit and a first anode pattern; the planarization compensation pattern is respectively coupled to the first sub-pixel driving circuit and the first anode pattern.

Optionally, the planarization compensation pattern includes a first compensation portion and a second compensation portion; the first compensation portion is a strip structure extending along the first direction, and an orthographic projection of the first compensation portion on the base substrate partially overlaps the orthographic projection of the first pixel opening on the base substrate; an orthographic projection of the second compensation portion on the base substrate does not overlap the orthographic projection of the first pixel opening on the base substrate.

Optionally, the orthographic projection of the first compensation portion on the base substrate is located within an orthographic projection of the first anode pattern on the base substrate; the orthographic projection of the second compensation portion on the base substrate partially overlaps the orthographic projection of the first anode pattern on the base substrate.

Optionally, the display substrate further includes a plurality of second sub-pixels, and the second sub-pixel includes a second pixel opening; an orthographic projection of at least part of the second pixel opening on the base substrate is located between orthographic projections of adjacent data lines on the base substrate.

Optionally, the display substrate further includes a plurality of third sub-pixels; the third sub-pixel includes a third pixel opening, and an orthographic projection of the third pixel opening on the base substrate is located between the orthographic projections of adjacent data lines on the base substrate; the plurality of first sub-pixels, the plurality of second sub-pixels and the plurality of third sub-pixels are divided into a plurality of pixel units, each pixel unit includes one first sub-pixel, one second sub-pixel and one third sub-pixel; in one pixel unit, the second pixel opening and the third pixel opening are located in a same column along the first direction, and the first pixel opening is located in another column.

Optionally, the second subpixel includes a second connection portion, a second subpixel driving circuit and a second anode pattern, and the second connection portion is coupled to the second sub-pixel driving circuit and the second anode pattern; the second connection portion is arranged at a same layer and made of a same material as the data line, and an orthographic projection of the second connection portion on the base substrate is located between an orthographic projection of the second pixel opening on the base substrate and an orthographic projection of the third pixel opening on the base substrate; the second pixel opening and the third pixel opening are located in a same column along the first direction.

Optionally, the display substrate further includes: a plurality of power supply lines, at least part of the plurality of power supply lines extending along the first direction; a plurality of power supply compensation lines, wherein the plurality of power supply compensation lines are in one-to-one correspondence with the at least part of the plurality of power supply lines, and an orthographic projection of the power supply compensation line on the base substrate at least partially overlaps an orthographic projection of a corresponding power supply line on the base substrate, and the power supply compensation line is coupled to the corresponding power supply line.

Optionally, the plurality of power supply lines include a plurality of first power supply lines, and the plurality of power supply compensation lines include a plurality of first power supply compensation lines, an orthographic projection of the first power supply compensation line on the base substrate at least partially overlaps an orthographic projection of a corresponding first power supply line on the base substrate, and the first power supply compensation line is coupled to the corresponding first power supply line; the orthographic projection of the first power supply line on the base substrate does not overlap the orthographic projection of the first pixel opening on the base substrate, and the orthographic projection of the first power supply compensation line on the base substrate does not overlap the orthographic projection of the first pixel opening on the base substrate.

Optionally, the plurality of power supply lines include a plurality of second power supply lines, and the plurality of power supply compensation lines include a plurality of second power supply compensation lines, an orthographic projection of the second power supply compensation line on the base substrate at least partially overlaps an orthographic projection of a corresponding second power supply line on the base substrate, and the second power supply compensation line is coupled to the corresponding second power supply line; the orthographic projection of the second power supply line on the base substrate partially overlaps the orthographic projection of the first pixel opening on the base substrate, and the orthographic projection of the second power supply compensation line on the base substrate does not overlap the orthographic projection of the first pixel opening on the base substrate.

Optionally, the plurality of power supply lines include a plurality of second power supply lines, and the plurality of power supply compensation lines include a plurality of second power supply compensation lines, an orthographic projection of the second power supply compensation line on the base substrate at least partially overlaps an orthographic projection of a corresponding second power supply line on the base substrate, and the second power supply compensation line is coupled to the corresponding second power supply line; the orthographic projection of the second power supply line on the base substrate partially overlaps the orthographic projection of the first pixel opening on the base substrate, and the orthographic projection of the second power supply compensation line on the base substrate partially overlaps the orthographic projection of the first pixel opening on the base substrate; at least part of the orthographic projection of the target data line on the base substrate is located between the orthographic projection of the second power supply compensation line on the base substrate and the orthographic projection of the planarization compensation pattern on the base substrate.

Optionally, the plurality of power supply lines include a plurality of third power supply lines, and an orthographic projection of the third power supply line on the base substrate at least partially overlaps an orthographic projection of the second pixel opening on the base substrate; the orthographic projection of the third power supply line on the base substrate at least partially overlaps the orthographic projection of the third pixel opening on the base substrate.

Optionally, the display substrate further includes: a plurality of first initialization signal lines, at least part of the first initialization signal line extending along the second direction; a plurality of initialization compensation patterns, at least part of the initialization compensation pattern extending along the first direction; adjacent first initialization signal lines being coupled to each other through at least one initialization compensation pattern.

Optionally, the plurality of power supply lines include a plurality of second power supply lines; an orthographic projection of the initialization compensation pattern on the base substrate at least partially overlaps an orthographic projection of the second power supply line on the base substrate.

Optionally, the orthographic projection of the initialization compensation pattern on the base substrate partially overlaps the orthographic projection of the first pixel opening on the base substrate, and at least part of the orthographic projection of the target data line on the base substrate is located between the orthographic projection of the initialization compensation pattern on the base substrate and the orthographic projection of the planarization compensation pattern on the base substrate.

Optionally, the orthographic projection of the second power supply line on the base substrate partially overlaps the orthographic projection of the first pixel opening on the base substrate.

Optionally, the plurality of power supply lines include a plurality of first power supply lines; the orthographic projection of the initialization compensation pattern on the base substrate at least partially overlaps an orthographic projection of the first power supply line on the base substrate.

Optionally, the orthographic projection of the initialization compensation pattern on the base substrate does not overlap the orthographic projection of the first pixel opening on the base substrate.

Optionally, the plurality of pixel units are divided into a plurality of columns of pixel units, and each column of pixel units include a plurality of pixel units arranged along the first direction; the display substrate further includes a plurality of first power supply lines, a plurality of second power supply lines and a plurality of third power supply lines; the first power supply line is respectively coupled to each first sub-pixel in a corresponding row of pixel units; the second power supply line is respectively coupled to each second sub-pixel in a corresponding row of pixel units; the third power supply line is respectively coupled to each third sub-pixel in a corresponding row of pixel units.

Optionally, the first sub-pixel includes a blue sub-pixel, the second sub-pixel includes a red sub-pixel, and the third sub-pixel includes a green sub-pixel; the third power supply line, the second power supply line and the first power supply line are arranged in sequence along the second direction.

Optionally, the data line, the planarization compensation pattern, the power supply compensation line and the initialization compensation pattern are arranged at a same layer and made of a same material, the power supply line and the power compensation line are arranged in different layers.

Optionally, the display substrate further includes a plurality of second initialization signal lines, and the second initialization signal line includes at least part extending along the second direction; the first sub-pixel, the second sub-pixel and the third sub-pixel all include a sub-pixel driving circuit; the sub-pixel driving circuit includes a driving transistor, a first reset transistor, a second reset transistor and a light emitting element; a first electrode of the first reset transistor is coupled to a corresponding first initialization signal line, and a second electrode of the first reset transistor is coupled to a gate electrode of the driving transistor; a first electrode of the second reset transistor is coupled to a corresponding second initialization signal line, and a second electrode of the second reset transistor is coupled to the light emitting element.

In a second aspect, an embodiment of the present disclosure provides a display device including the display substrate.

BRIEF DESCRIPTION OF THE DRAWINGS

The drawings described herein are used to provide a further understanding of the present disclosure and constitute a part of the present disclosure. The schematic embodiments and their descriptions of the present disclosure are used to explain the present disclosure, and do not constitute an improper limitation of the present disclosure.

DETAILED DESCRIPTION

Figure 1:
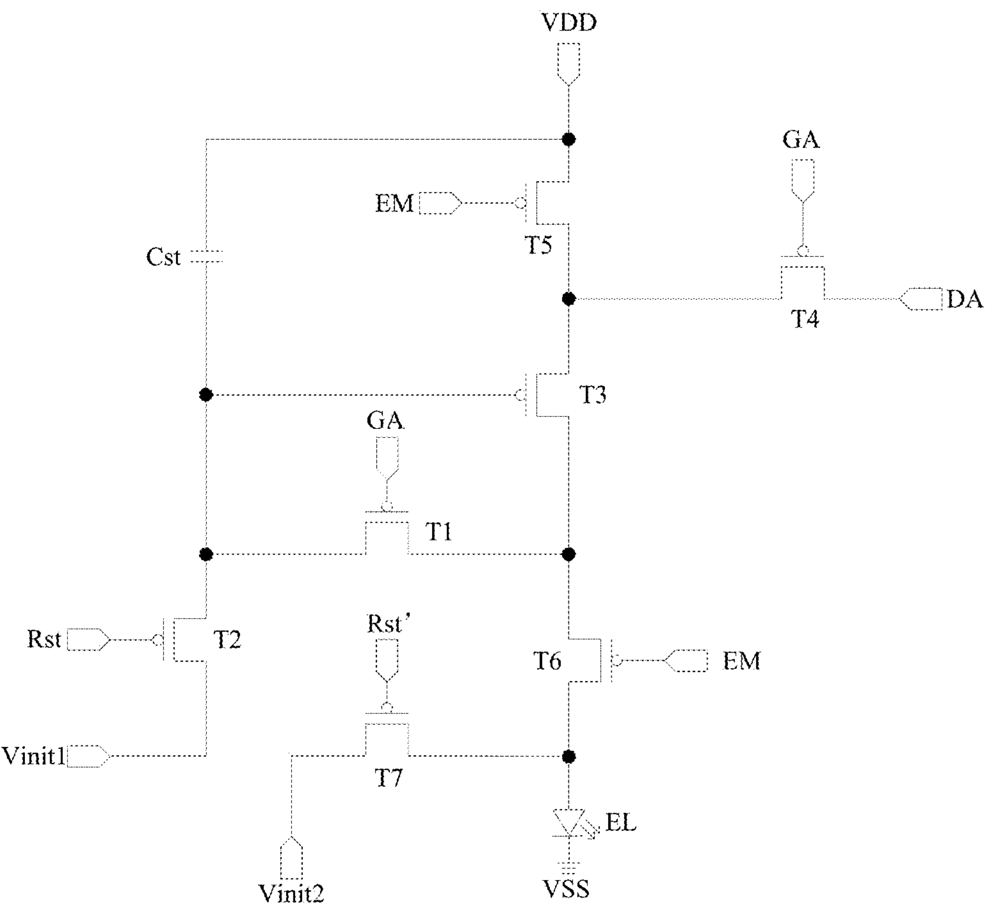
FIG. 1 is a circuit structural diagram of a sub-pixel driving circuit provided by an embodiment of the present disclosure.

In order to further explain the display substrate and display device provided by the embodiments of the present disclosure, the following will be described in detail with reference to the drawings of the disclosure.

The greater the pixel density of the display is, the smaller the layout space occupied by each sub-pixel is, the more difficult the sub-pixel layout is, and the harder it is to ensure the flatness of the anode pattern under the pixel opening of the sub-pixel. However, the flatness of the anode pattern under the pixel opening will affect the color shift parameters of the display, thereby affecting the display quality of the display.

Referring to FIG. 3, FIG. 8, FIG. 9, FIG. 13, FIG. 14 and FIG. 16, an embodiment of the present disclosure provides a display substrate, including: a base substrate, a plurality of data lines DA arranged on the base substrate, and a plurality of first sub-pixels arranged on the base substrate; the first sub-pixel includes:

a first pixel opening 11, an orthographic projection of the first pixel opening 11 on the base substrate partially overlaps an orthographic projection of a target data line among the plurality of data lines DA on the base substrate;

A planarization compensation pattern 20, at least part of the planarization compensation pattern 20 extends along a first direction, an orthographic projection of the planarization compensation pattern 20 on the base substrate at least partially overlaps an orthographic projection of the first pixel opening 11 on the base substrate, the planarization compensation pattern 20 and the target data line DA are arranged along a second direction, and the second direction intersects the first direction.

Exemplarily, the target data line includes a data line DA coupled to a sub-pixel adjacent to the first sub-pixel along the second direction.

It should be noted that at least part of the planarization compensation pattern 20 extending along the first direction means that at least part of the planarization compensation pattern 20 is a line, a line segment or a bar-shaped body, and the at least part of the planarization compensation pattern 20 extends along the first direction, and the length of the at least part extending along the first direction is greater than lengths of other parts extending along other directions.

Exemplarily, the display substrate includes a plurality of data lines DA arranged along the second direction, and the data lines DA include at least a part extending along the first direction.

Exemplarily, the display substrate includes a plurality of first sub-pixels, a plurality of second sub-pixels and a plurality of third sub-pixels, the first sub-pixel include a first sub-pixel driving circuit, and the second sub-pixel includes a second sub-pixel driving circuit, the third sub-pixel includes a third sub-pixel driving circuit, the first sub-pixel driving circuit, the second sub-pixel driving circuit and the third sub-pixel driving circuit all include 7T1C circuit structure.

Exemplarily, the plurality of first sub-pixels includes a plurality of first sub-pixel driving circuits, and the plurality of first sub-pixel driving circuits are divided into a plurality of columns of first sub-pixel driving circuits, and each column of first sub-pixel driving circuits include a plurality of first sub-pixel driving circuits arranged along the first direction. The plurality of second sub-pixels include a plurality of second sub-pixel driving circuits, the plurality of second sub-pixel driving circuits are divided into a plurality of columns of second sub-pixel driving circuits, and each column of second sub-pixel driving circuits includes a plurality of second sub-pixel driving circuits arranged along the first direction. The plurality of third sub-pixels include a plurality of third sub-pixel driving circuits, the plurality of third sub-pixel driving circuits are divided into a plurality of columns of third sub-pixel driving circuits, and each column of third sub-pixel driving circuits include a plurality of third sub-pixel driving circuits arranged along the first direction.

The column of third sub-pixel driving circuits, the column of second sub-pixel driving circuits and the first column of sub-pixel driving circuits are arranged circularly in sequence along the second direction.

Exemplarily, the plurality of data lines DA and the plurality of columns of sub-pixel driving circuits in the display substrate (including the plurality of columns of first sub-pixel driving circuits, the plurality of columns of second sub-pixel driving circuits and the plurality of columns of third sub-pixels driving circuit) are in one-to-one correspondence, the data line DA is coupled to each sub-pixel driving circuit of the corresponding column of sub-pixel driving circuits (the column of first sub-pixel driving circuits, the column of second sub-pixel driving circuits or the column of the third sub-pixel driving circuits).

Exemplarily, the first sub-pixel further includes a first light-emitting element, the first light-emitting element includes a first anode pattern 51 and a first light-emitting functional layer, and the first anode pattern 51 is coupled to the first sub-driving circuit in the first sub-pixel to which the first anode pattern 51 belongs, to receive the driving signal provided by the first sub-pixel driving circuit.

Exemplarily, the first sub-pixel further includes a first pixel opening 11, and the pixel defining layer in the display substrate defines the first pixel opening 11. The orthographic projection of the first pixel opening 11 on the base substrate is located within the orthographic projection of the first anode pattern 51 in the first sub-pixel to which the first pixel opening 11 belongs on the base substrate.

It should be noted that the orthographic projection of the first pixel opening 11 on the base substrate refers to an orthographic projection of a pattern enclosed by the boundary of the first pixel opening 11 on the base substrate.

Exemplarily, the orthographic projection of the first pixel opening 11 on the base substrate partially overlaps the orthographic projection of the target data line on the base substrate, so that the orthographic projection of a part of anode pattern overlapping the first pixel opening 11 on the base substrate partially overlaps the orthographic projection of the target data line on the base substrate. Exemplarily, the target data line includes a data line DA coupled to a second sub-pixel adjacent to the first sub-pixel along the second direction.

Exemplarily, the orthographic projection of the planarization compensation pattern 20 on the base substrate at least partially overlaps the orthographic projection of the first pixel opening 11 on the base substrate, so that the orthographic projection of a part of anode pattern overlapping the first pixel opening 11 on the base substrate partially overlaps the orthographic projection of the planarization compensation pattern 20 on the base substrate.

Exemplarily, the orthographic projection of the planarization compensation pattern 20 on the base substrate and the orthographic projection of at least part of the target data line on the base substrate are arranged along the second direction. Exemplarily, the first direction includes a vertical direction, and the second direction includes a horizontal direction.

Exemplarily, the orthographic projection of the left part of the first pixel opening 11 on the base substrate partially overlaps the orthographic projection of the target data line among the plurality of data lines DA on the base substrate. The orthographic projection of the right part of the first pixel opening 11 on the base substrate partially overlaps the orthographic projection of the planarization compensation pattern 20 on the base substrate. The left part and the right part are opposed along the second direction.

According to the specific structure of the above-mentioned display substrate, in the display substrate provided by the embodiment of the present disclosure, the orthographic projection of the first pixel opening 11 on the base substrate partially overlaps the orthographic projection of the target data line among the plurality of data lines DA on the base substrate; and the orthographic projection of the first pixel opening 11 on the base substrate partially overlaps the orthographic projection of the planarization compensation pattern 20 on the base substrate; the orthographic projection of a part of the first anode pattern 51 overlapping the first pixel opening 11 on the base substrate partially overlaps the orthographic projection of the target data line among the plurality of data lines DA on the base substrate; and the orthographic projection of a part of the first anode pattern 51 overlapping the first pixel opening 11 on the base substrate partially overlaps the orthographic projection of the planarization compensation pattern 20 on the base substrate. The planarization compensation pattern 20 compensates the level difference generated by the target data line under the first anode pattern 51, so that the structure under the first anode pattern 51 can be evenly and symmetrically distributed, and the flatness of the first anode pattern 51 is improved, which effectively improves the color shift parameter of the display substrate and ensures the display quality of the display substrate.

As shown in FIG. 3, FIG. 13 to FIG. 16, in some embodiments, the first sub-pixel further includes a first sub-pixel driving circuit and a first anode pattern 51; the planarization compensation pattern 20 is respectively coupled to the first sub-pixel driving circuit and the first anode pattern 51.

Exemplarily, the first anode pattern 51 is located on the side of the first sub-pixel driving circuit away from the base substrate, and the planarization compensation pattern 20 is located between the first sub-pixel driving circuit and the first anode patterns 51.

Since the first anode pattern 51 is far away from the first sub-pixel driving circuit, the planarization compensation pattern 20 is used for connection therebetween, which can better ensure the connection stability and reliability between the first anode pattern 51 and the first sub-pixel driving circuit.

Moreover, the planarization compensation pattern 20 has both a planarization compensation function and a connection function, which effectively reduces the layout difficulty of the display substrate.

Figure 8:
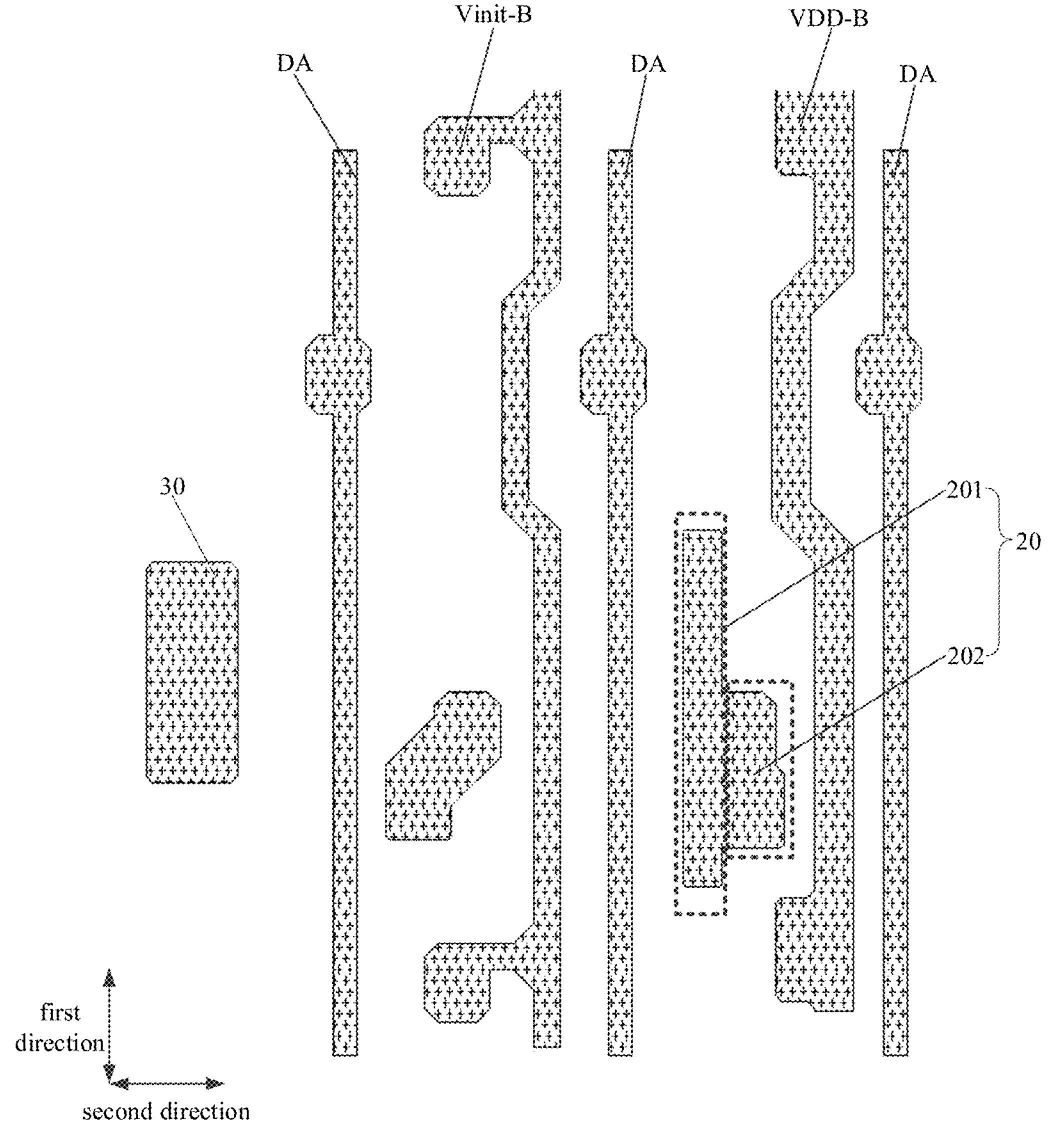
FIG. 8 is a schematic diagram of a layout of a second source-drain metal layer in FIG. 3.
Figure 9:
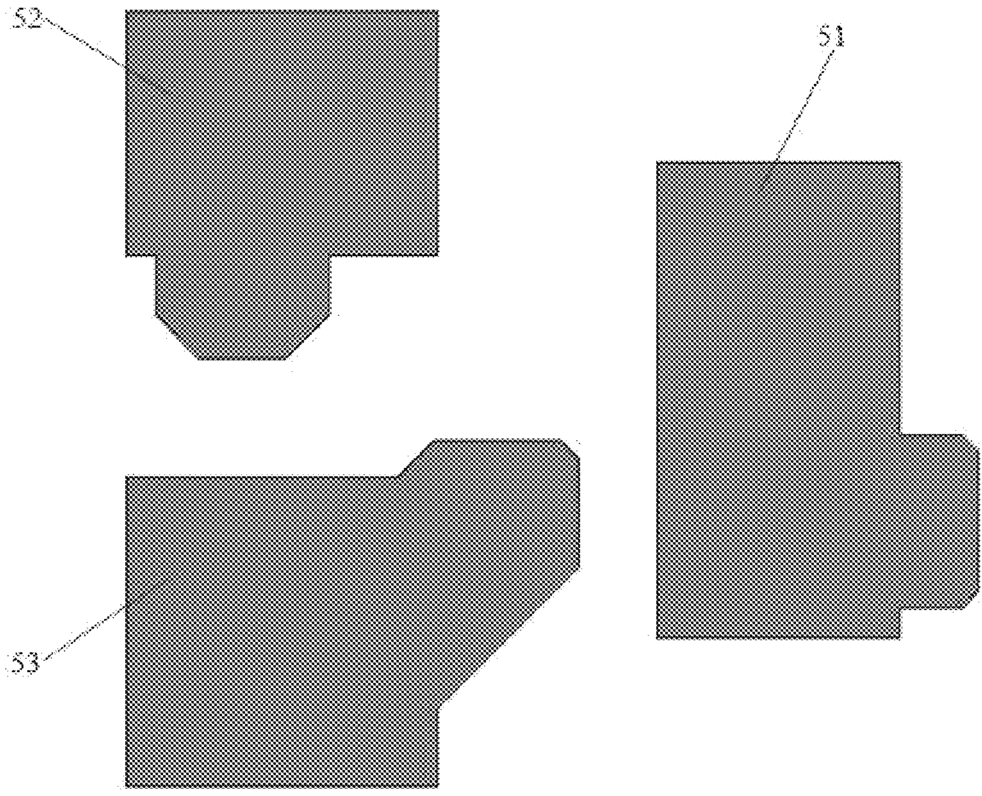
FIG. 9 is a schematic diagram of a layout of the anode layer in FIG. 3.
Figure 10:
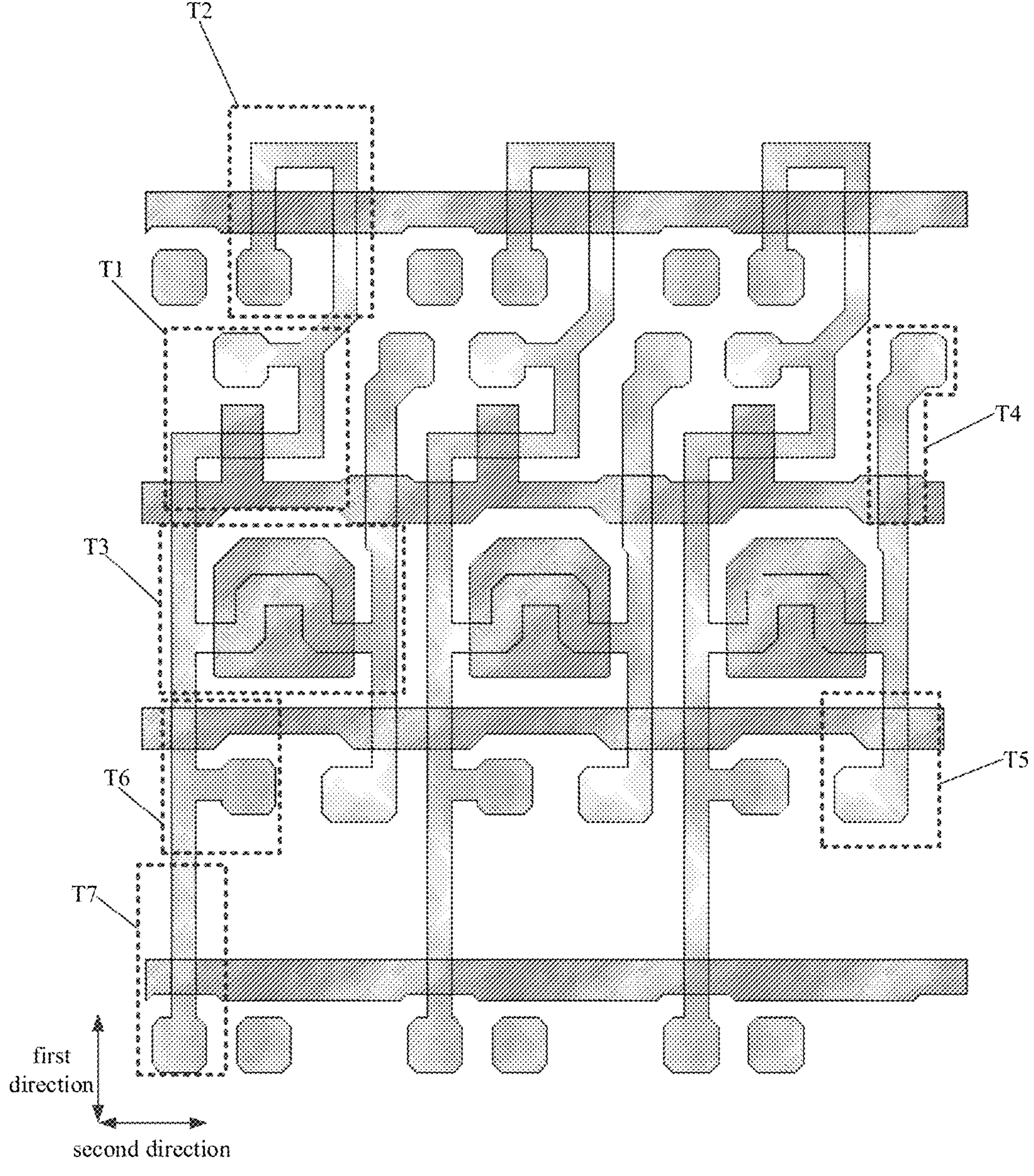
FIG. 10 is a schematic diagram of a layout of the active layer and the first gate metal layer in FIG. 3.
Figure 11:
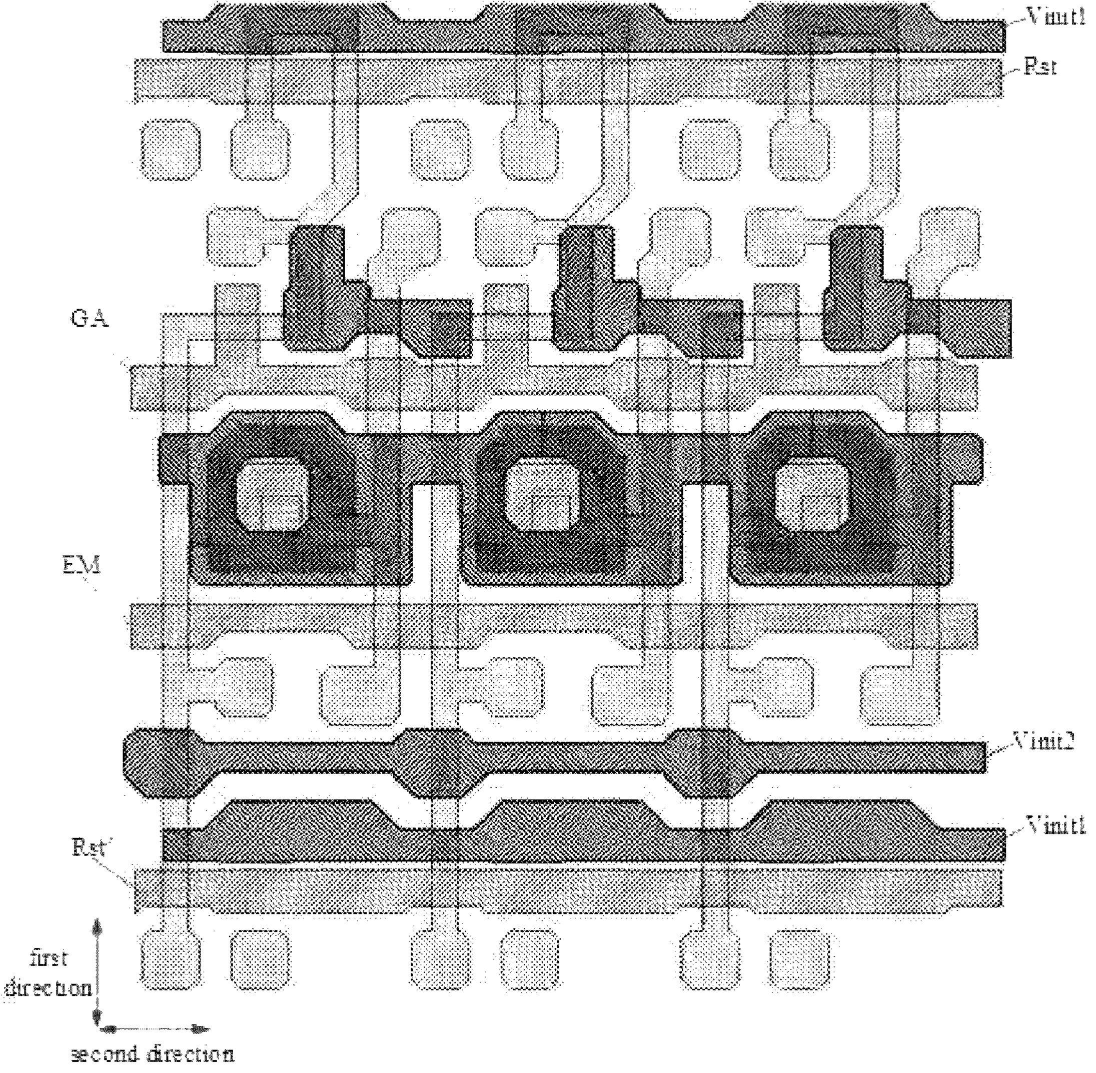
FIG. 11 is a schematic diagram of a layout of the active layer, the first gate metal layer and the second gate metal layer in FIG. 3.
Figure 12:
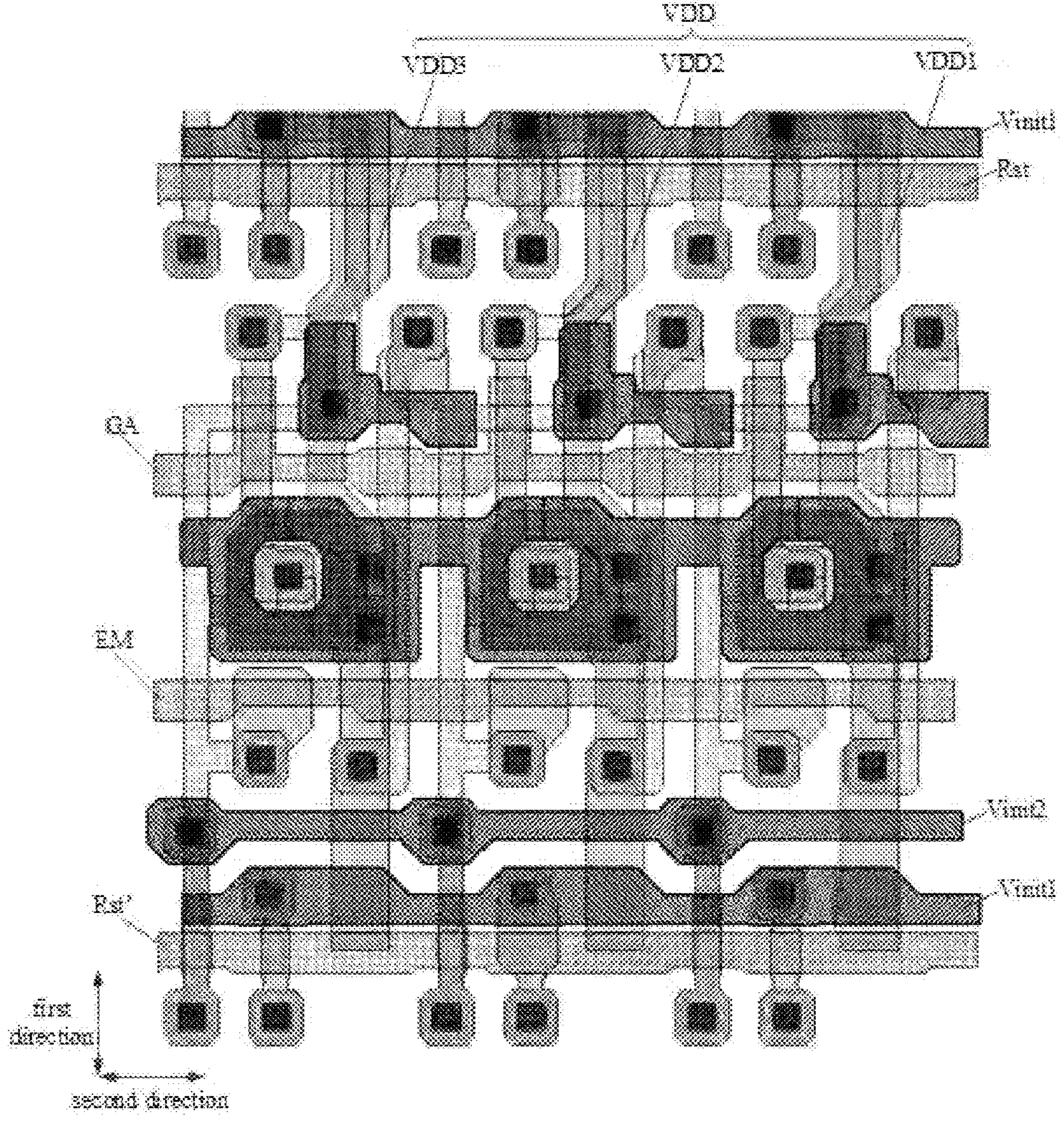
FIG. 12 is a schematic diagram of a layout of the active layer to the first source-drain metal layer in FIG. 3.
Figure 13:
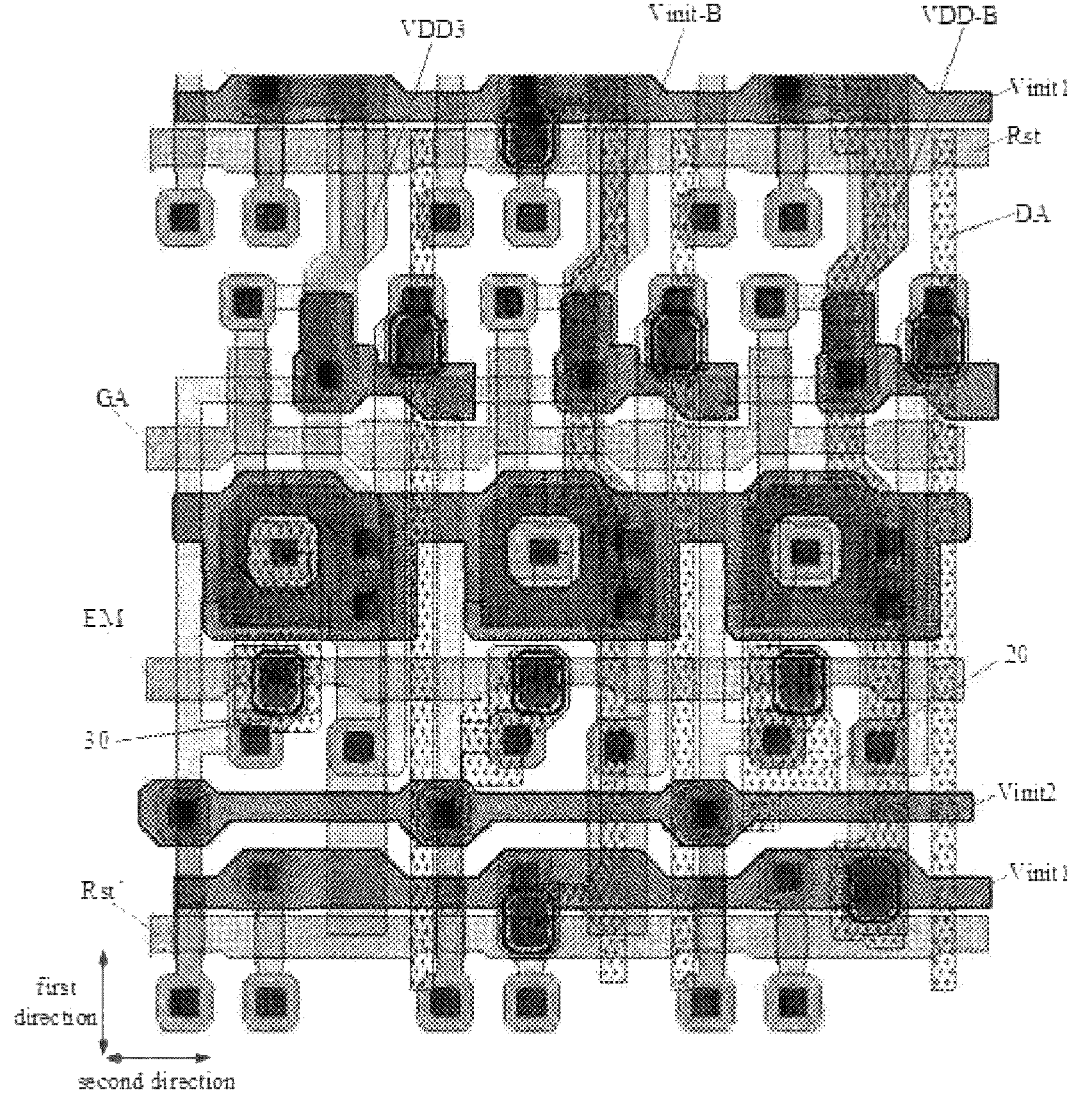
FIG. 13 is a schematic diagram of a layout of the active layer to the second source-drain metal layer in FIG. 3.
Figure 14:
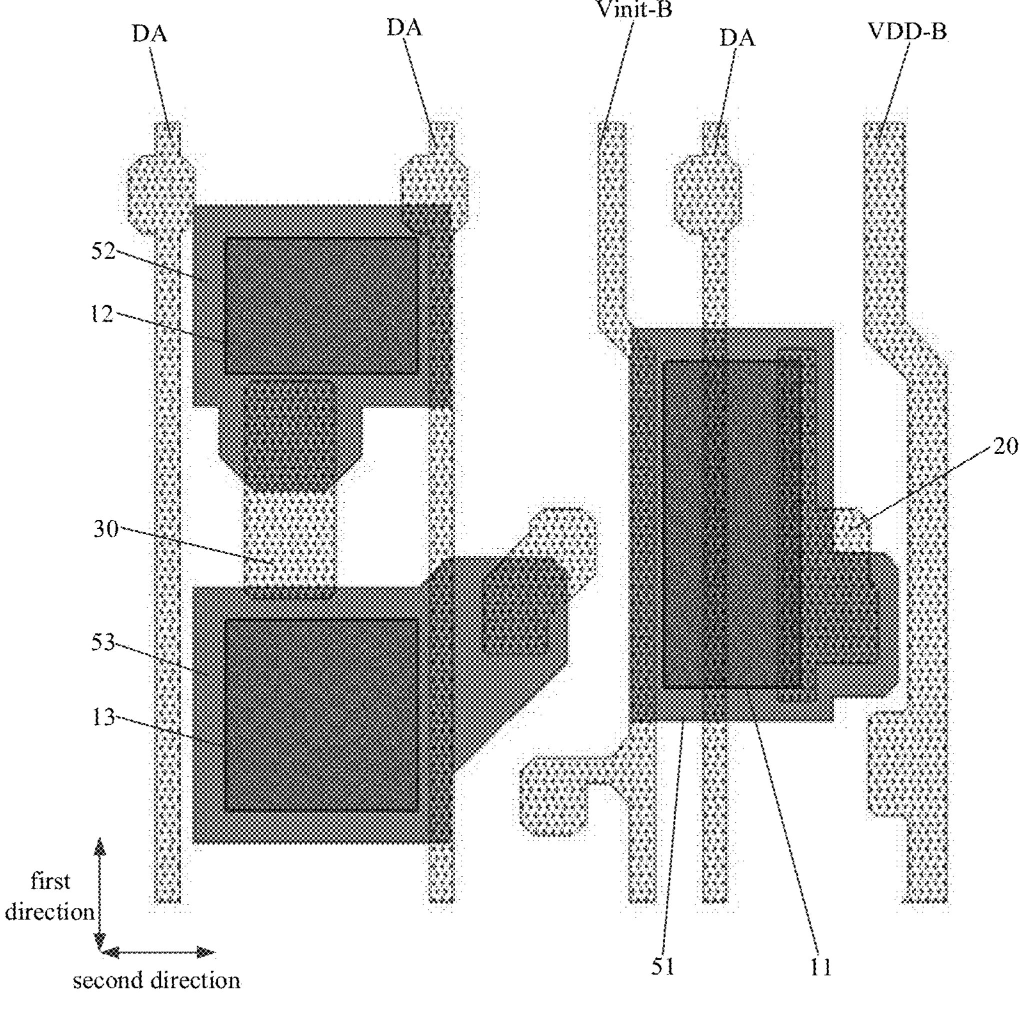
FIG. 14 is a schematic diagram of a layout of a second source-drain metal layer and an anode layer in a pixel unit provided by an embodiment of the present disclosure.
Figure 15:
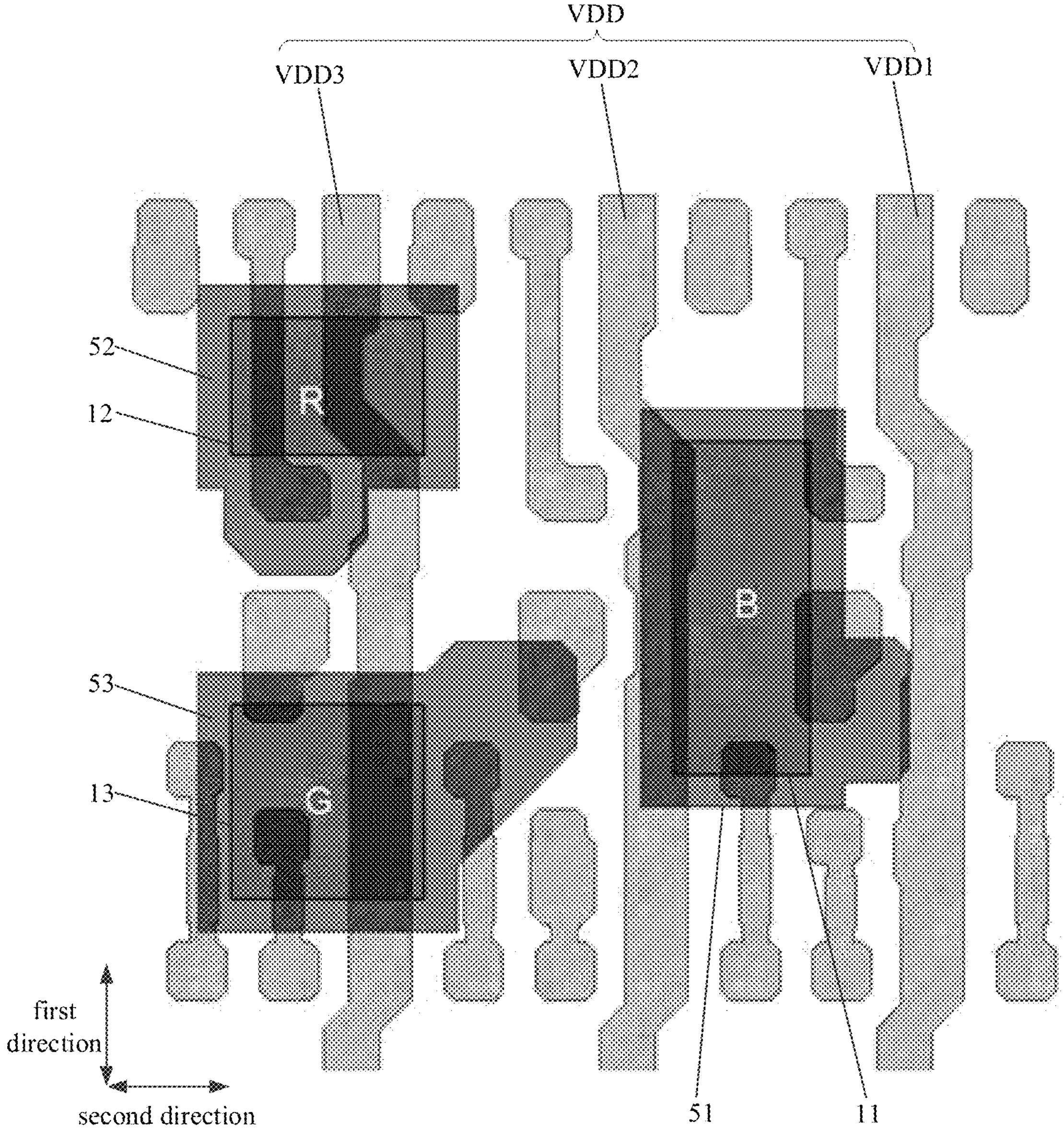
FIG. 15 is a schematic diagram of a layout of a first source-drain metal layer and an anode layer in a pixel unit provided by an embodiment of the present disclosure.

As shown in FIG. 8 and FIG. 14, in some embodiments, the planarization compensation pattern 20 includes a first compensation portion 201 and a second compensation portion 202;

The first compensation portion 201 is a strip structure extending along the first direction, and the orthographic projection of the first compensation portion 201 on the base substrate partially overlaps the orthographic projection of the first pixel opening 11 on the base substrate;

The orthographic projection of the second compensation portion 202 on the base substrate does not overlap the orthographic projection of the first pixel opening 11 on the base substrate.

Exemplarily, the second compensation portion 202 is coupled to the first sub-pixel driving circuit and the first anode pattern 51 respectively.

As shown in FIG. 8 and FIG. 14, in some embodiments, the orthographic projection of the first compensation portion 201 on the base substrate is located within the orthographic projection of the first anode pattern 51 on the base substrate;

The orthographic projection of the second compensation portion 202 on the base substrate partially overlaps the orthographic projection of the first anode pattern 51 on the base substrate.

The above setting method not only ensures the connection stability and reliability between the first anode pattern 51 and the first sub-pixel driving circuit, but also ensures the flatness of the first anode pattern 51, effectively reducing the layout difficulty of the display substrate.

As shown in FIG. 3, FIG. 13 to FIG. 16, in some embodiments, the display substrate further includes a plurality of second sub-pixels, and the second sub-pixel includes second pixel opening 12; the orthographic projection of at least part of the second pixel openings 12 on the base substrate is located between the orthographic projections of adjacent data lines DA on the base substrate.

Exemplarily, the orthographic projection of the second pixel opening 12 on the base substrate does not overlap the orthographic projection of the data line DA on the base substrate.

Exemplarily, the second subpixel includes a second subpixel driving circuit and a second anode pattern 52, and the second anode pattern 52 is coupled to the second subpixel driving circuit and receives the driving signal provided by the second subpixel driving circuit.

Exemplarily, the orthographic projection of the second pixel opening 12 on the base substrate is located within the orthographic projection of the second anode pattern 52 on the base substrate.

Exemplarily, the orthographic projection of a part of the second anode pattern 52 overlapping the second pixel opening 12 on the base substrate does not overlap the orthographic projection of the data line DA on the base substrate.

The above arrangement makes the flatness of the part of the second anode pattern 52 overlapping the second pixel opening 12 not affected by the data line DA, which further ensures the color shift parameters of the display substrate.

As shown in FIG. 3, FIG. 13 to FIG. 16, in some embodiments, the display substrate further includes a plurality of third sub-pixels; the third sub-pixel includes a third pixel opening 13, and the orthographic projection of the third pixel openings 13 on the base substrate is located between the orthographic projections of adjacent data lines DA on the base substrate;

The plurality of first sub-pixels, the plurality of second sub-pixels and the plurality of third sub-pixels are divided into a plurality of pixel units, each pixel unit includes one first sub-pixel, one second sub-pixel and one third sub-pixel; in one pixel unit, the second pixel opening 12 and the third pixel opening 13 are located in the same column along the first direction, and the first pixel opening 11 is located in another column.

Exemplarily, the orthographic projection of the third pixel opening 13 on the base substrate does not overlap the orthographic projection of the data line DA on the base substrate.

Exemplarily, the third subpixel includes a third subpixel driving circuit and a third anode pattern 53, and the third anode pattern 53 is coupled to the third subpixel driving circuit and receives the driving signal provided by the third subpixel driving circuit.

Exemplarily, the orthographic projection of the third pixel opening 13 on the base substrate is located within the orthographic projection of the third anode pattern 53 on the base substrate.

Exemplarily, the orthographic projection of a part of the third anode pattern 53 overlapping the third pixel opening 13 on the base substrate does not overlap the orthographic projection of the data line DA on the base substrate.

Exemplarily, in one pixel unit, the first sub-pixel driving circuit, the second sub-pixel driving circuit and the third sub-pixel driving circuit are arranged in sequence along the first direction.

Exemplarily, the display substrate includes a plurality of pixel units, and the plurality of pixel units are divided into a plurality of columns of pixel units, and in each column of pixel units: the second pixel opening 12 and the third pixel opening 13 is located in the same column along the first direction, and the second pixel openings 12 and the third pixel openings 13 are arranged alternately; the first pixel opening 11 is located in another column.

Exemplarily, the display substrate adopts real RGB pixel arrangement.

The above arrangement makes the flatness of the part of the third anode pattern 53 overlapping the third pixel opening 13 not affected by the data line DA, which further ensures the color shift parameters of the display substrate.

As shown in FIG. 3, FIG. 13 to FIG. 16, in some embodiments, the second subpixel includes a second connection portion 30, a second subpixel driving circuit and a second anode pattern 52, and the second connection portion 30 are respectively coupled to the second sub-pixel driving circuit and the second anode pattern 52;

The second connection portion 30 is arranged at the same layer and the same material as the data line DA, and the orthographic projection of the second connection portion 30 on the base substrate is located between the orthographic projection of the second pixel opening 12 on the base substrate and the orthographic projection of the third pixel opening 13 on the base substrate; the second pixel opening 12 and the third pixel opening 13 are located in the same column along the first direction.

Exemplarily, the second connection portion 30 is made of a second source-drain metal layer.

Exemplarily, both the second pixel opening 12 and the third pixel opening 13 can avoid the second source-drain metal layer, and do not overlap the structure formed with the second source-drain metal layer in a direction vertical to the base substrate.

Exemplarily, at least part of the second connection portion 30 is located between the second sub-pixel driving circuit and the second anode pattern 52.

Exemplarily, the orthographic projection of the second connection portion 30 on the base substrate does not overlap the orthographic projection of the second pixel opening 12 on the base substrate. The orthographic projection of the second connection portion 30 on the base substrate does not overlap the orthographic projection of the third pixel opening 13 on the base substrate.

Exemplarily, the orthographic projection of the second connection portion 30 on the base substrate partially overlaps the orthographic projection of the second anode pattern 52 on the base substrate. The orthographic projection of the second connection portion 30 on the base substrate partially overlaps the orthographic projection of the third anode pattern 53 on the base substrate.

The orthographic projection of the second connection portion 30 on the base substrate is located between the orthographic projection of the second pixel opening 12 on the base substrate and the orthographic projection of the third pixel opening 13 on the base substrate, so that the flatness of the part of the second anode pattern 52 overlapping the second pixel opening 12 and the flatness of the part of the third anode pattern 53 overlapping the third pixel opening 13 is not affected by the second connection portion 30, thereby ensuring the color shift parameters of the display substrate.

As shown in FIG. 3, FIG. 7, FIG. 8, FIG. 12 to FIG. 16, in some embodiments, the display substrate further includes:

a plurality of power supply lines VDD, at least part of the plurality of power supply lines VDD extending along the first direction;

A plurality of power supply compensation lines VDD-B, the plurality of power supply compensation lines VDD-B are in one-to-one correspondence with the at least part of the power supply lines VDD, and the orthographic projection of the power supply compensation lines VDD-B on the base substrate at least partially overlaps the orthographic projection of the corresponding power supply line VDD on the base substrate, and the power supply compensation line VDD-B is coupled to the corresponding power supply line VDD.

Exemplarily, the plurality of power supply lines VDD are loaded with the same power signal.

Exemplarily, the plurality of power supply lines VDD are arranged along the second direction.

Exemplarily, the power supply line VDD is made of the first source-drain metal layer.

Exemplarily, the minimum line width of the power supply line VDD is less than or equal to 3 microns.

Exemplarily, the power supply compensation line VDD-B is located on a side of the power supply line VDD away from the base substrate.

Exemplarily, the power supply compensation line VDD-B is coupled to the corresponding power supply line VDD through a via hole.

Exemplarily, the power supply compensation line VDD-B includes at least a portion extending along the first direction.

Exemplarily, the display substrate includes a plurality of pixel units, and the plurality of pixel units are divided into a plurality of columns of pixel units. The plurality of columns of pixel units correspond to the plurality of power supply compensation lines VDD-B in a one-to-one manner. At least part of the power supply compensation line VDD-B is located in a layout area of a corresponding column of pixel units.

Exemplarily, the extension length of the power supply compensation line VDD-B is approximately the same as the extension length of the power supply line VDD; or, the extension length of the power supply compensation line VDD-B is shorter than the extension length of the power supply line VDD.

Since the sub-pixel layout space of the display substrate with high pixel density is limited, it is necessary to appropriately reduce the line width of the power supply line VDD. The display substrate also includes the power supply compensation line VDD-B, so that the power supply line VDD and the power supply compensation line VDD-B have a double-layer design, which reduces the resistance of the power supply line VDD, and can ensure the display uniformity of the display substrate in the case of narrowing the line width of the power supply line VDD.

As shown in FIG. 3, FIG. 7, FIG. 8, FIG. 12 to FIG. 16, in some embodiments, the plurality of power supply lines VDD include a plurality of first power supply lines VDD1, and the plurality of power supply compensation lines VDD-B include a plurality of first power supply compensation line, the orthographic projection of the first power supply compensation line on the base substrate at least partially overlaps the orthographic projection of the corresponding first power supply line VDD1 on the base substrate, and the first power supply compensation line is coupled to the corresponding first power supply line VDD1;

The orthographic projection of the first power supply line VDD1 on the base substrate does not overlap the orthographic projection of the first pixel opening 11 on the base substrate, and the orthographic projection of the first power supply compensation line on the base substrate does not overlap the orthographic projection of the first pixel opening 11 on the base substrate.

Exemplarily, the plurality of power supply lines include a plurality of first power supply lines VDD1, a plurality of second power supply lines VDD2 and a plurality of third power supply lines VDD3. The first power supply line VDD1, the second power supply line VDD2 and the third power supply line VDD3 are electrically connected. Exemplarily, the second electrode plates Cst2 of the storage capacitors Cst included in the sub-pixel driving circuits located in the same row along the second direction are sequentially coupled, and the second electrode plate Cst2 of each sub-pixel driving circuit is coupled to the corresponding power supply line. The power supply line, the power supply compensation line VDD-B, and the second electrode plate Cst2 form a grid structure together.

The plurality of first power supply lines VDD1 correspond to the plurality of columns of first sub-pixel driving circuits in a one-to-one manner, and the first power supply line VDD1 is coupled to each first sub-pixel driving circuit in a corresponding column of first sub-pixel driving circuits.

The plurality of second power supply lines VDD2 correspond to the plurality of columns of second sub-pixel driving circuit in a one-to-one manner, and the second power supply line VDD2 is coupled to each second sub-pixel driving circuit in a corresponding column of second sub-pixel driving circuits.

The plurality of third power supply lines VDD3 correspond to the plurality of columns of third sub-pixel driving circuits in a one-to-one manner, and the third power supply line VDD3 is coupled to each third sub-pixel driving circuit in a corresponding column of third sub-pixel driving circuits.

Exemplarily, the plurality of first power supply compensation lines correspond to the plurality of first power supply lines VDD1 in a one-to-one manner, and there is an overlapping area between the orthographic projection of the first power supply compensation line on the base substrate and the orthographic projection of the corresponding first power supply line TVDD1 on the base substrate, and the first power compensation line is coupled to the corresponding first power supply line VDD1 through a via hole in the overlapping area.

The above arrangement of the display substrate including the first power supply line VDD1 and the first power supply compensation line effectively reduces the overall resistance of the power supply line of the display substrate and improves the display uniformity of the display substrate.

In the above setting, the orthographic projection of the first power supply line VDD1 on the base substrate does not overlap the orthographic projection of the first pixel opening 11 on the base substrate, and the orthographic projection of the first power supply compensation line on the base substrate does not overlap the orthographic projection of the first pixel opening 11 on the base substrate, thereby avoiding the effect of the first power supply line VDD1 and the first power supply compensation line on the flatness of the first anode pattern 51.

As shown in FIG. 3, FIG. 7, FIG. 12 and FIG. 15, in some embodiments, the plurality of power supply lines include a plurality of second power supply lines VDD2, and the plurality of power supply compensation lines include a plurality of second power supply compensation lines, the orthographic projection of the second power supply compensation line on the base substrate at least partially overlaps the orthographic projection of the corresponding second power supply line VDD2 on the base substrate, and the second power supply compensation line is coupled to the corresponding second power supply Line VDD2;

The orthographic projection of the second power supply line VDD2 on the base substrate partially overlaps the orthographic projection of the first pixel opening 11 on the base substrate, and the orthographic projection of the second power supply compensation line on the base substrate does not overlap the orthographic projection of the first pixel opening 11 on the base substrate.

Exemplarily, the plurality of second power supply compensation lines correspond to the plurality of second power supply lines VDD2 in a one-to-one manner, and there is an overlapping area between the orthographic projection of the second power supply compensation lines on the base substrate and the orthographic projection of the corresponding second power supply line VDD2 on the base substrate, and the second power compensation line is coupled to the corresponding second power supply line VDD2 through a via hole in the overlapping area.

The above arrangement of the display substrate including the second power supply line VDD2 and the second power supply compensation line effectively reduces the overall resistance of the power supply line of the display substrate and improves the display uniformity of the display substrate.

The orthographic projection of the second power supply compensation line on the base substrate does not overlap the orthographic projection of the first pixel opening 11 on the base substrate, thereby avoiding the effect of the second power supply compensation line on the flatness of the first anode pattern 51.

As shown in FIG. 3, FIG. 7, FIG. 12 and FIG. 15, in some embodiments, the plurality of power supply lines include a plurality of second power supply lines VDD2, and the plurality of power supply compensation lines include a plurality of second power supply compensation lines, the orthographic projection of the second power supply compensation line on the base substrate at least partially overlaps the orthographic projection of the corresponding second power supply line VDD2 on the base substrate, and the second power supply compensation line is coupled to the corresponding second power supply Line VDD2;

The orthographic projection of the second power supply line VDD2 on the base substrate partially overlaps the orthographic projection of the first pixel opening 11 on the base substrate, and the orthographic projection of the second power supply compensation line on the base substrate partially overlaps the orthographic projection of the first pixel opening 11 on the base substrate;

At least part of the orthographic projection of the target data line DA on the base substrate is located between the orthographic projection of the second power supply compensation line on the base substrate and the orthographic projection of the planarization compensation pattern 20 on the base substrate.

Exemplary, exemplary, the plurality of second power supply compensation lines correspond to the plurality of second power supply lines VDD2 in a one-to-one manner, and there is an overlapping area between the orthographic projection of the second power supply compensation line on the base substrate and the orthographic projection of the corresponding second power supply line VDD2 on the base substrate, and the second power compensation line is coupled to the corresponding second power supply line VDD2 through a via hole in the overlapping area.

The above arrangement of the display substrate including the second power supply line VDD2 and the second power supply compensation line effectively reduces the overall resistance of the power supply line of the display substrate and improves the display uniformity of the display substrate.

The orthographic projection of the second power compensation line on the base substrate partially overlaps the orthographic projection of the first pixel opening 11 on the base substrate; at least part of the orthographic projection of the target data line on the base substrate is located between the orthographic projection of the second power supply compensation line on the base substrate and the orthographic projection of the planarization compensation pattern 20 on the base substrate; thereby effectively improving the flatness of the first anode pattern 51.

As shown in FIG. 3, FIG. 7, FIG. 12 and FIG. 15, in some embodiments, the plurality of power supply lines include a plurality of third power supply lines VDD3, and the orthographic projection of the third power supply line VDD3 on the base substrate at least partially overlap the orthographic projection of the second pixel opening 12 on the base substrate; the orthographic projection of the third power supply line VDD3 on the base substrate partially overlaps the orthographic projection of the third pixel opening 13 on the base substrate.

Exemplarily, the first power supply line VDD1, the second power supply line VDD2 and the third power supply line VDD3 are all made of a first source-drain metal layer, and the distance between the first source-drain metal layer and the anode pattern is relatively far, and there are two planarization layers between the first source-drain metal layer and the anode pattern, therefore, the effect of the first power supply line VDD1, the second power supply line VDD2 and the third power supply line VDD3 on the flatness of the anode pattern is little.

As shown in FIG. 3, FIG. 6, FIG. 7, FIG. 8, FIG. 10 to FIG. 16, in some embodiments, the display substrate further includes:

a plurality of first initialization signal lines Vinit1, at least part of the first initialization signal line Vinit1 extending along the second direction;

A plurality of initialization compensation patterns Vinit-B, at least part of the initialization compensation pattern Vinit-B extending along the first direction; adjacent first initialization signal lines Vinit1 being coupled to each other through at least one initialization compensation pattern Vinit-B.

Exemplarily, the first initialization signal line Vinit1 is made of the second gate metal layer. The initialization compensation pattern Vinit-B is made by the second source-drain metal layer.

Exemplarily, the first initialization signal line Vinit1 is used to transmit a first initialization signal.

Exemplarily, the first initialization signal line is coupled to the initialization compensation pattern Vinit-B through a transfer pattern and a via hole. Exemplarily, the transfer pattern is made by the first source-drain metal layer.

Exemplarily, adjacent first initialization signal lines Vinit1 are coupled through a plurality of initialization compensation patterns Vinit-B. The plurality of pixel units located in the same row along the second direction correspond to the plurality of initialization compensation patterns Vinit-B in a one-to-one manner. At least part of the initialization compensation pattern Vinit-B is located in the layout area of the corresponding pixel unit.

Exemplarily, the initialization compensation patterns Vinit-B located in the same column along the first direction are sequentially coupled to form an integrated structure.

The display substrate includes the first initialization signal line Vinit1 and the initialization compensation pattern Vinit-B, so that the first initialization signal line Vinit1 and the initialization compensation pattern Vinit-B form a grid structure, thereby improving the resistance of the first initialization signal line Vinit1, and improving the display uniformity of the display substrate under high gray scale.

Figure 16:
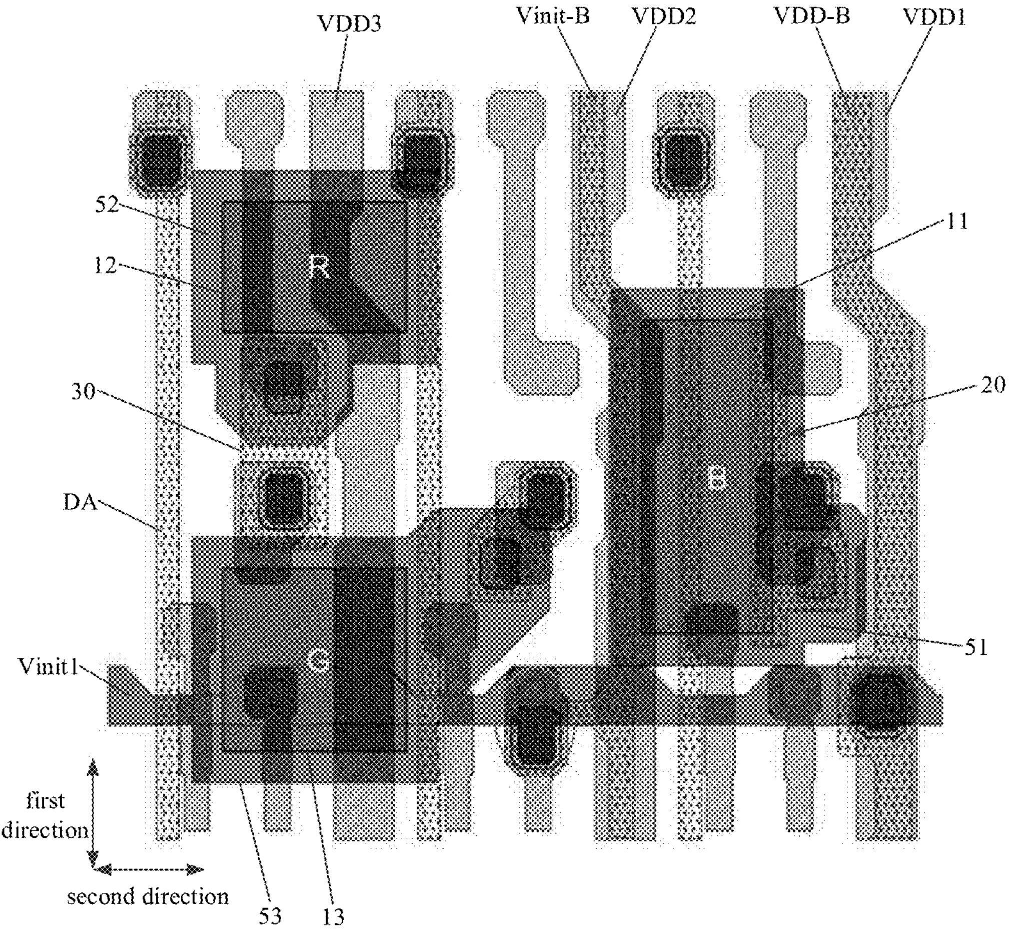
FIG. 16 is a schematic diagram of a layout of the first source-drain metal layer, the second source-drain metal layer and the anode layer in the pixel unit provided by an embodiment of the present disclosure.

As shown in FIG. 16, in some embodiments, the plurality of power supply lines include a plurality of second power supply lines VDD2; the orthographic projection of the initialization compensation pattern Vinit-B on the base substrate at least partially overlaps the orthographic projection of the second power supply line VDD2 on the base substrate.

Exemplarily, the line width of the initialization compensation pattern Vinit-B in a direction perpendicular to its extension direction is smaller than the line width of the second power supply line VDD2 in a direction perpendicular to its own extension direction.

In the above setting, the orthographic projection of the initialization compensation pattern Vinit-B on the base substrate at least partially overlaps the orthographic projection of the second power supply line VDD2 on the base substrate, and the second power supply line VDD2 can be used to shield the signal on the initialization compensation pattern Vinit-B, thereby effectively avoids forming the additional parasitic capacitor between the initialization compensation pattern Vinit-B and other structures in the display substrate.

In some embodiments, the orthographic projection of the initialization compensation pattern Vinit-B on the base substrate partially overlaps the orthographic projection of the first pixel opening 11 on the base substrate, and at least part of the orthographic projection of the target data line DA on the base substrate is located between the orthographic projection of the initialization compensation pattern Vinit-B on the base substrate and the orthographic projection of the planarization compensation pattern 20 on the base substrate.

The arrangement further improves the flatness of the part of the first anode pattern 51 under the first pixel opening 11.

In some embodiments, the orthographic projection of the second power supply line VDD2 on the base substrate partially overlaps the orthographic projection of the first pixel opening 11 on the base substrate.

In some embodiments, the plurality of power supply lines include a plurality of first power supply lines VDD1; the orthographic projection of the initialization compensation pattern Vinit-B on the base substrate at least partially overlaps the orthographic projection of the first power supply line VDD1 on the base substrate.

Exemplarily, the line width of the initialization compensation pattern Vinit-B in a direction perpendicular to its own extension direction is smaller than the line width of the first power supply line VDD1 in a direction perpendicular to its own extension direction.

As shown in FIG. 16, for example, the initialization compensation pattern Vinit-B and the power compensation line VDD-B overlap different power supply lines.

In the above setting, the orthographic projection of the initialization compensation pattern Vinit-B on the base substrate at least partially overlaps the orthographic projection of the first power supply line VDD1 on the base substrate, and the first power supply line VDD1 can used to shield the signal on the initialization compensation pattern Vinit-B, thereby effectively avoiding forming additional parasitic capacitor between the initialization compensation pattern Vinit-B and other structures in the display substrate.

As shown in FIG. 16, in some embodiments, the orthographic projection of the initialization compensation pattern Vinit-B on the base substrate does not overlap the orthographic projection of the first pixel opening 11 on the base substrate.

The above arrangement makes the flatness of the part of the first anode pattern 51 under the first pixel opening 11 not affected by the initialization compensation pattern Vinit-B.

As shown in FIG. 16, in some embodiments, the plurality of pixel units are divided into a plurality of columns of pixel units, and each column of pixel units includes a plurality of pixel units arranged along the first direction;

The display substrate further includes a plurality of first power supply lines VDD1, a plurality of second power supply lines VDD2 and a plurality of third power supply lines VDD3;

The first power supply line VDD1 is respectively coupled to each first sub-pixel in a corresponding row of pixel units;

The second power supply line VDD2 is respectively coupled to each second sub-pixel in a corresponding row of pixel units;

The third power supply line VDD3 is respectively coupled to each third sub-pixel in a corresponding row of pixel units.

Exemplarily, the plurality of first power supply lines VDD1 correspond to the plurality of columns of pixel units in a one-to-one manner, the plurality of second power supply lines VDD2 correspond to the plurality of columns of pixel units in a one-to-one manner, and the plurality of third power supply lines VDD3 correspond to the plurality of columns of pixel units in a one-to-one manner; the first power supply line VDD1, the second power supply line VDD2 and the third power supply line VDD3 are loaded with the same power supply signal;

Exemplarily, the first power supply line VDD1, the second power supply line VDD2 and the third power supply line VDD3 are loaded with the same power signal.

Exemplarily, the display substrate further includes a power supply bus in the non-display area, and the first power supply line VDD1, the second power supply line VDD2 and the third power supply line VDD3 are all coupled to the power supply bus.

As shown in FIG. 16, in some embodiments, the first sub-pixel includes a blue sub-pixel, the second sub-pixel includes a red sub-pixel, and the third sub-pixel includes a green sub-pixel; the third power supply line VDD3, the second power supply line VDD2 and the first power supply line VDD1 are arranged in sequence along the second direction.

Figure 7:
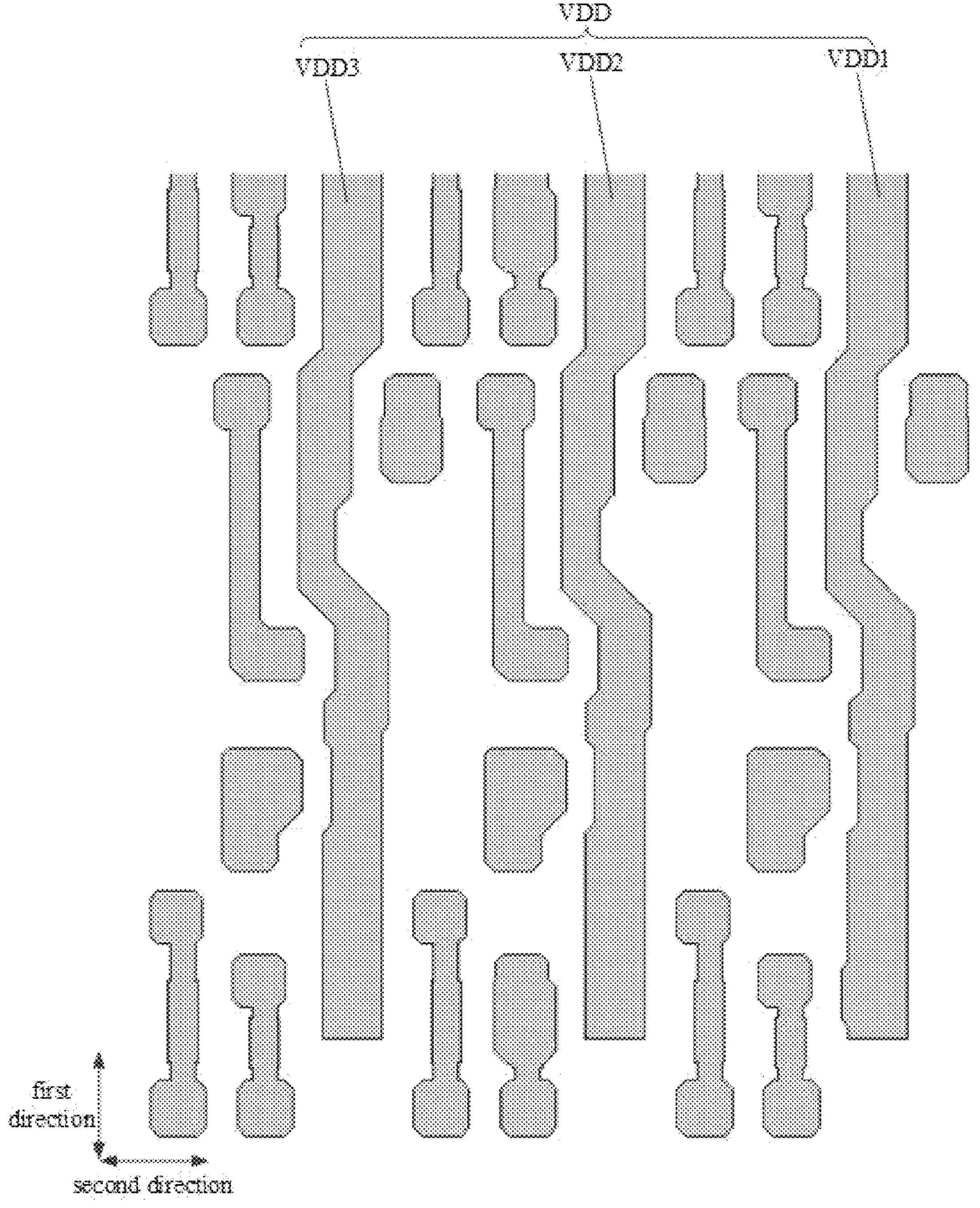
FIG. 7 is a schematic diagram of a layout of the first source-drain metal layer in FIG. 3.

As shown in FIGS. 7 and 8, in some embodiments, the data line DA, the planarization compensation pattern 20, the power supply compensation line VDD-B and the initialization compensation pattern Vinit-B are arranged at the same layer and made of the same material, the power supply line and the power compensation line VDD-B are arranged in different layers.

Exemplarily, the data line DA, the planarization compensation pattern 20, the power supply compensation line VDD-B and the initialization compensation pattern Vinit-B are all made by the second source-drain metal layer. The power supply line is made by the first source-drain metal layer.

As shown in FIG. 6, FIG. 10 to FIG. 13, in some embodiments, the display substrate further includes a plurality of second initialization signal lines Vinit2, and the second initialization signal line Vinit2 includes at least part extending along the second direction; the first sub-pixel, the second sub-pixel and the third sub-pixel all include a sub-pixel driving circuit; the sub-pixel driving circuit includes a driving transistor, a first reset transistor, a second reset transistor and a light emitting element;

A first electrode of the first reset transistor is coupled to the corresponding first initialization signal line Vinit1, and a second electrode of the first reset transistor is coupled to a gate electrode of the driving transistor;

A first electrode of the second reset transistor is coupled to the corresponding second initialization signal line Vinit2, and a second electrode of the second reset transistor is coupled to the light emitting element.

Exemplarily, the second initialization signal line Vinit2 is made of a second gate metal layer.

Exemplarily, the display substrate includes a plurality of gate lines GA, a plurality of reset lines Rst and a plurality of light emitting control lines EM; at least part of the gate line GA, at least part of the reset line Rst and at least part of the light emitting control line EM all extend along the second direction.

As shown in FIG. 1, FIG. 3 to FIG. 13, the sub-pixel driving circuit includes a first transistor T1 to a seventh transistor T7.

A gate electrode of the first transistor T1 is coupled to the corresponding gate line GA, a first electrode of the first transistor T1 is coupled to a second electrode of the third transistor T3 (that is, the driving transistor), and a second electrode of the first transistor T1 is coupled to the gate electrode of the third transistor T3.

A gate electrode of the second transistor T2 (that is, the first reset transistor) is coupled to the corresponding reset line Rst, and a first electrode of the second transistor T2 is coupled to the corresponding first initialization signal line Vinit1, a second electrode of the second transistor T2 is coupled to the gate electrode of the third transistor T3. The gate electrode of the third transistor T3 is also used as the first electrode plate Cst1 of the storage capacitor Cst, and the second electrode plate Cst2 of the storage capacitor Cst is coupled to the power supply line.

A gate electrode of the fourth transistor T4 is coupled to the corresponding gate line GA, a first electrode of the fourth transistor T4 is coupled to the corresponding data line DA, a second electrode of the fourth transistor T4 is coupled to a first electrode of the third transistor T3.

A gate electrode of the fifth transistor T5 is coupled to the corresponding light emitting control line EM, a first electrode of the fifth transistor T5 is coupled to the power supply line, a second electrode of the fifth transistor T5 is coupled to the first electrode of the third transistor T3.

A gate electrode of the sixth transistor T6 is coupled to the corresponding light emitting control line EM, a first electrode of the sixth transistor T6 is coupled to the second electrode of the third transistor T3, and a second electrode of the sixth transistor T6 is coupled to the anode of the light emitting element EL.

A gate electrode of the seventh transistor T7 (that is, the second reset transistor) is coupled to the reset line Rst coupled to the sub-pixels adjacent along the first direction, and the first electrode of the seventh transistor T7 is coupled to the second initialization signal line Vinit2, a second electrode of the seventh transistor T7 is coupled to the anode of the light emitting element EL, and the cathode of the light emitting element EL receives the negative power supply signal VSS.

Figure 17:
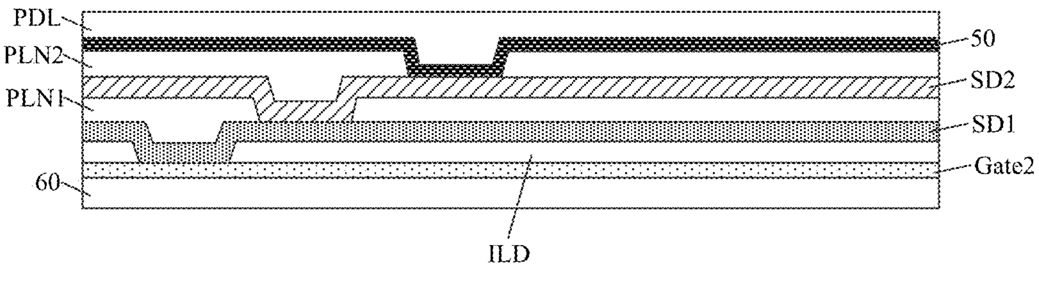
FIG. 17 is a partial cross-sectional schematic diagram of a display substrate provided by an embodiment of the present disclosure.

As shown in FIG. 17, for example, the display substrate includes an active layer, a first gate insulating layer, a first gate metal layer, a second gate insulating layer, a second gate metal layer Gate2, an interlayer insulating layer ILD, a first source-drain metal layer SD1, a first planarization layer PLN1, a second source-drain metal layer SD2, a second planarization layer PLN2, an anode layer 50, a pixel definition layer PDL, a light-emitting functional layer, a cathode layer and an encapsulation layer that are sequentially stacked along a direction away from the base substrate 60.

Figure 4:
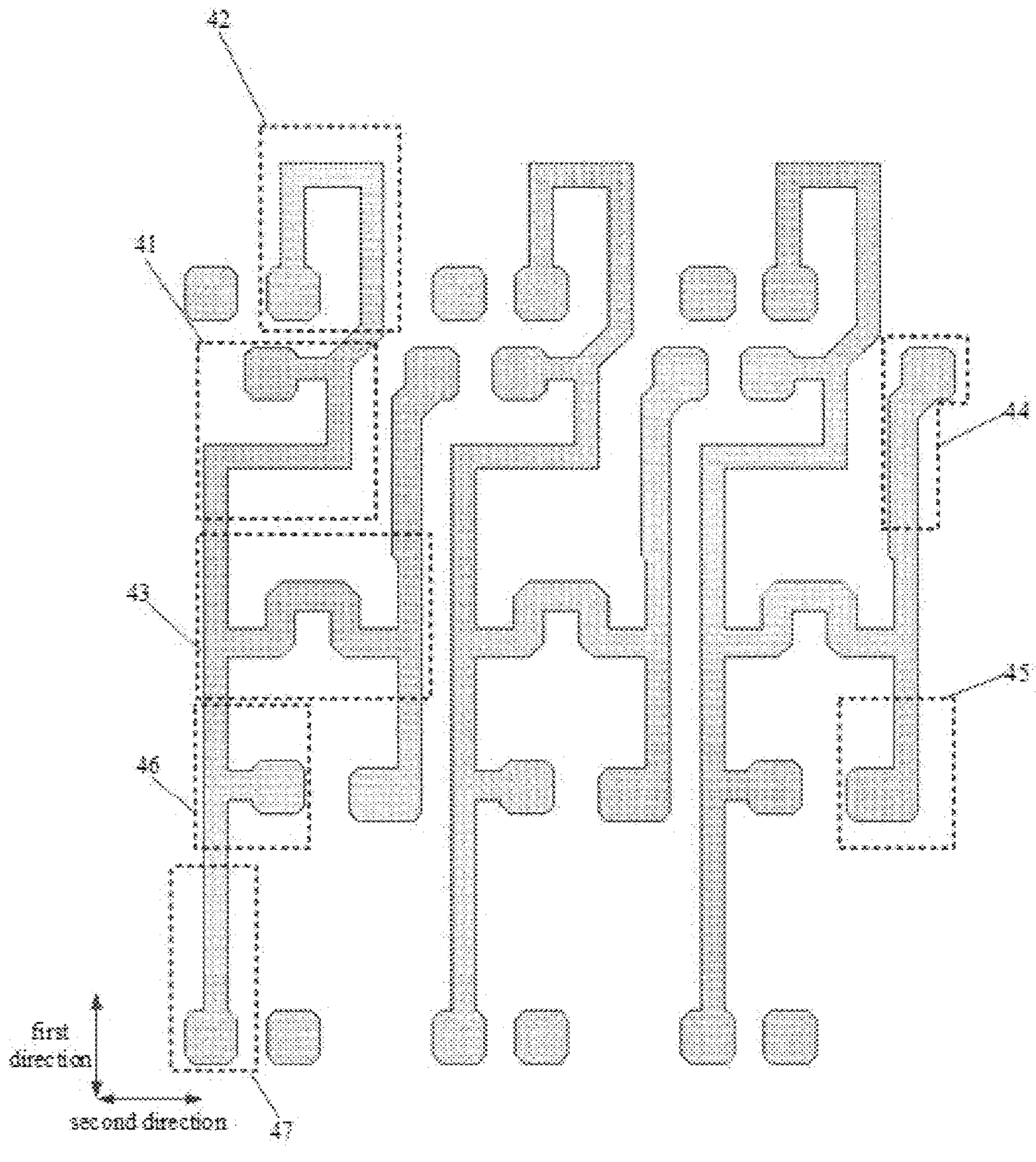
FIG. 4 is a schematic diagram of a layout of the active layer in FIG. 3.
Figure 5:
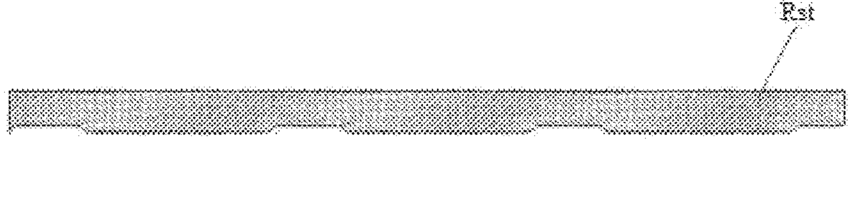
FIG. 5 is a schematic diagram of a layout of the first gate metal layer in FIG. 3.
Figure 5:
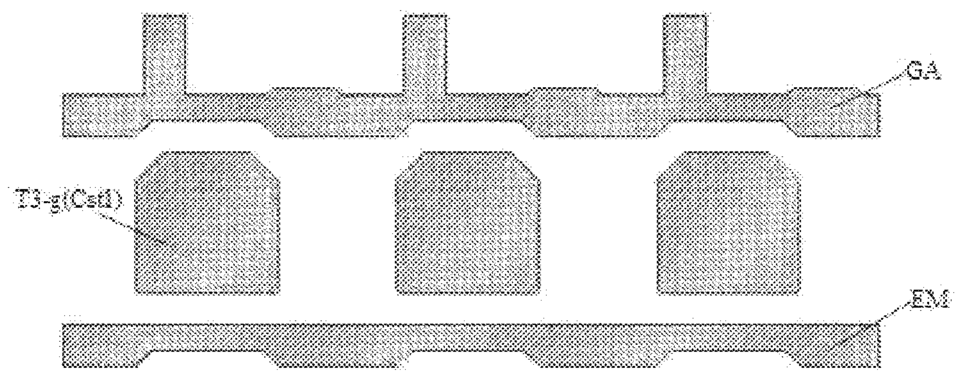
Figure 5:
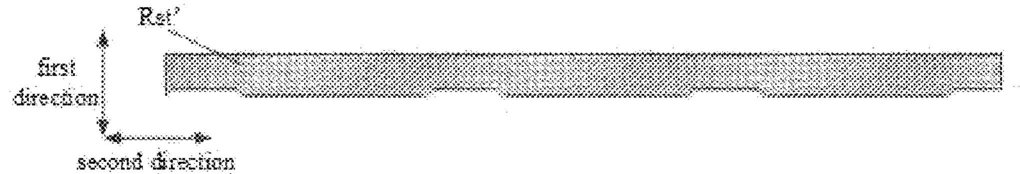
Figure 6:
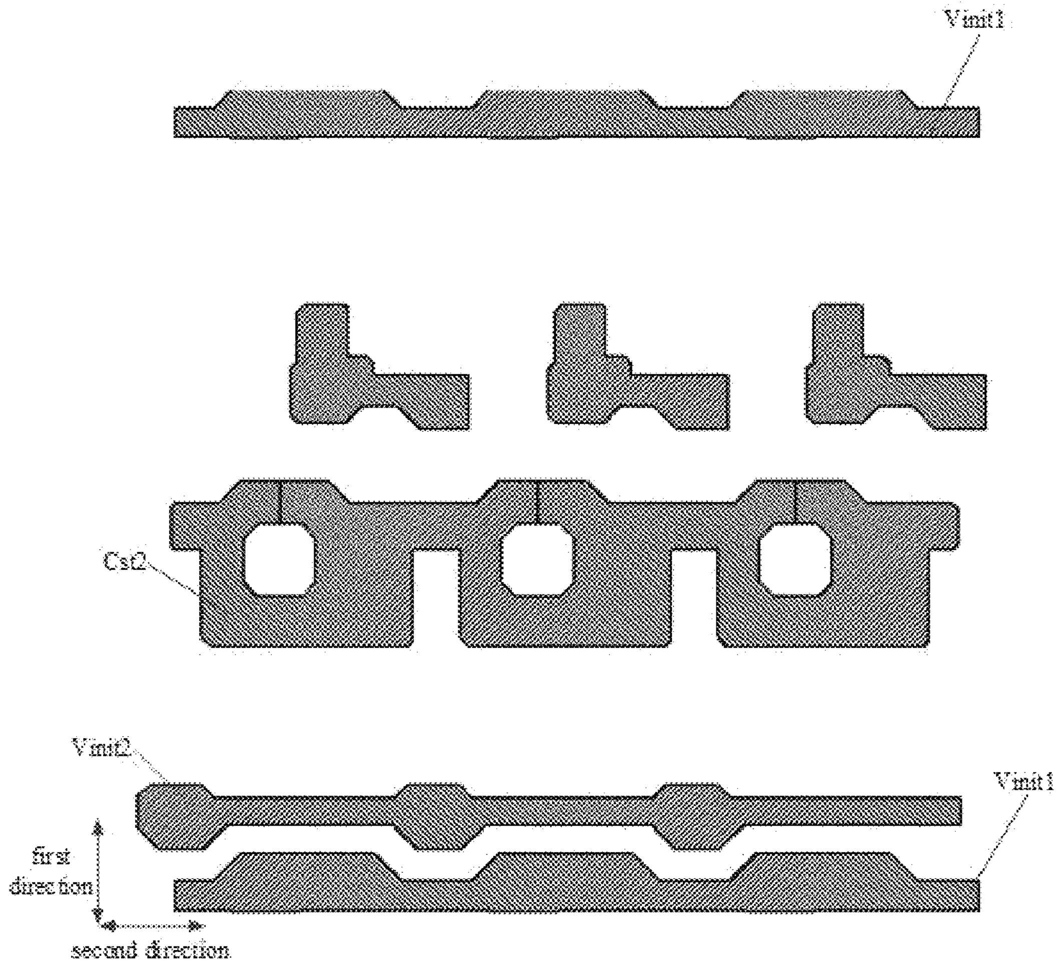
FIG. 6 is a schematic diagram of a layout of a second gate metal layer in FIG. 3.

As shown in FIG. 4, for example, the active layer is used to form the first active layer 41 included in the first transistor T1, the second active layer 42 included in the second transistor T2, the third active layer 43 included in the third transistor T3, the fourth active layer 44 included in the fourth transistor T4, the fifth active layer 45 included in the fifth transistor T5, the sixth active layer 46 included in the sixth transistor T6 and the seventh active layer 47 included in the seventh transistor T7.

Exemplarily, the first gate metal layer is used to form the reset line Rst, the gate line GA, the light emitting control line EM, and the gate electrode of each transistor.

Exemplarily, the second gate metal layer Gate2 is used to form the first initialization signal line Vinit1, the second initialization signal line Vinit2 and the second electrode plate Cst2 of the storage capacitor Cst.

Exemplarily, the first source-drain metal layer SD1 is used to form the power supply line VDD and some conductive patterns.

Exemplarily, the second source-drain metal layer is used to form the data line DA and some conductive patterns.

Exemplarily, the anode layer 50 is used to form an anode pattern included in each light emitting element EL.

Exemplarily, the base substrate of the display substrate includes an organic PI base substrate. The manufacturing process of the display substrate includes:

Depositing an active material layer on the base substrate, and patterning the active material layer to form the active layer. It should be noted that the patterning process includes: forming a photoresist on a side of the active material layer away from the base substrate, exposing and developing the photoresist, and then etching the active material layer by using remaining photoresist as a mask to form the active layer.

Depositing an inorganic material on a side of the active layer away from the base substrate to form the first gate insulating layer.

Depositing a metal material on a side of the first gate insulating layer away from the base substrate to form a first gate metal material layer, and patterning the first gate metal material layer to form the first gate metal layer.

Depositing an inorganic material on a side of the first gate metal layer away from the base substrate to form the second gate insulating layer.

Depositing a metal material on a side of the second gate insulating layer away from the base substrate to form a second gate metal material layer, and patterning the second gate metal material layer to form the second gate metal layer Gate2.

Forming the interlayer insulating layer ILD by depositing on a side of the second gate metal layer Gate2 away from the base substrate. A patterning process is performed to form a plurality of via holes. A first part of the plurality of via holes only penetrates the interlayer insulating layer ILD, the first part of the via holes can expose the second gate metal layer Gate2, and the first source-drain metal layer SD1 is coupled to the second gate metal layer Gate2 through the first part of via holes. A second part of the plurality of via holes can penetrate through the interlayer insulating layer ILD, the second gate insulating layer and the first gate insulating layer, and the second part of the via holes can expose the active layer, the first source-drain metal layer SD1 can be coupled to the active layer through the second part of via holes. The plurality of via holes may further include a third part of via holes, the third part of via holes can penetrate through the interlayer insulating layer ILD and the second gate insulating layer, and the third part of via holes can expose the first gate metal layer, the first source-drain metal layer SD1 can be coupled to the first gate metal layer through the third part of via holes.

Depositing a metal material layer on a side of the interlayer insulating layer ILD away from the base substrate, and patterning the metal material layer to form the first source-drain metal layer SD1.

Depositing a first planarization layer PLN1 on a side of the first source-drain metal layer SD1 away from the base substrate.

Depositing a metal material layer on a side of the first planarization layer PLN1 away from the base substrate, and patterning the metal material layer to form the second source-drain metal layer SD2.

Depositing a second planarization layer PLN2 on a side of the second source-drain metal layer SD2 away from the base substrate.

Depositing an anode material layer on a side of the second planarization layer PLN2 away from the base substrate, and patterning the anode material layer to form the anode layer 50.

Forming a pixel defining layer on a side of the anode layer 50 away from the base substrate, and the pixel defining layer includes a plurality of pixel openings.

Figure 2:
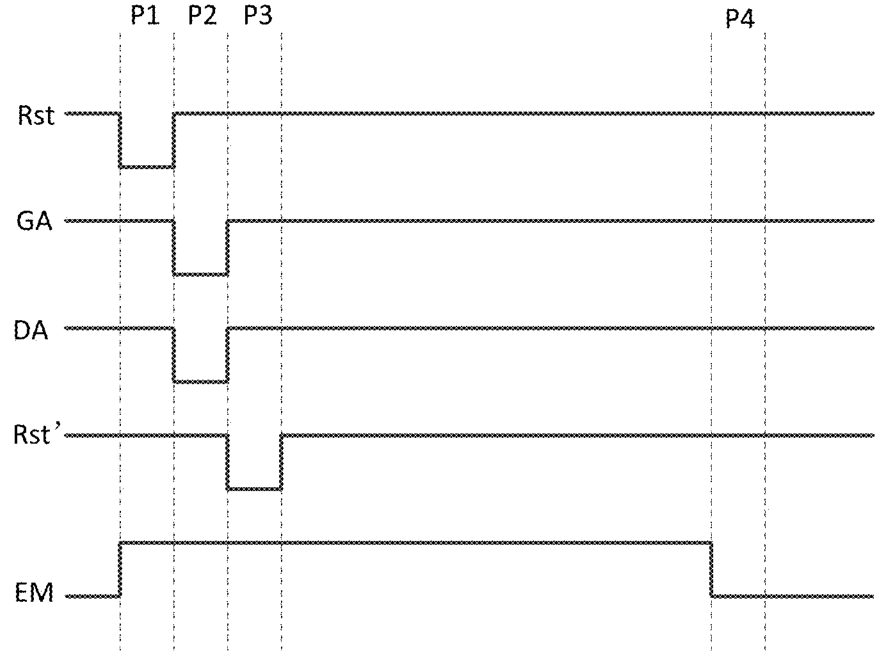
FIG. 2 is a driving timing diagram of a sub-pixel driving circuit provided by an embodiment of the present disclosure.
Figure 3:
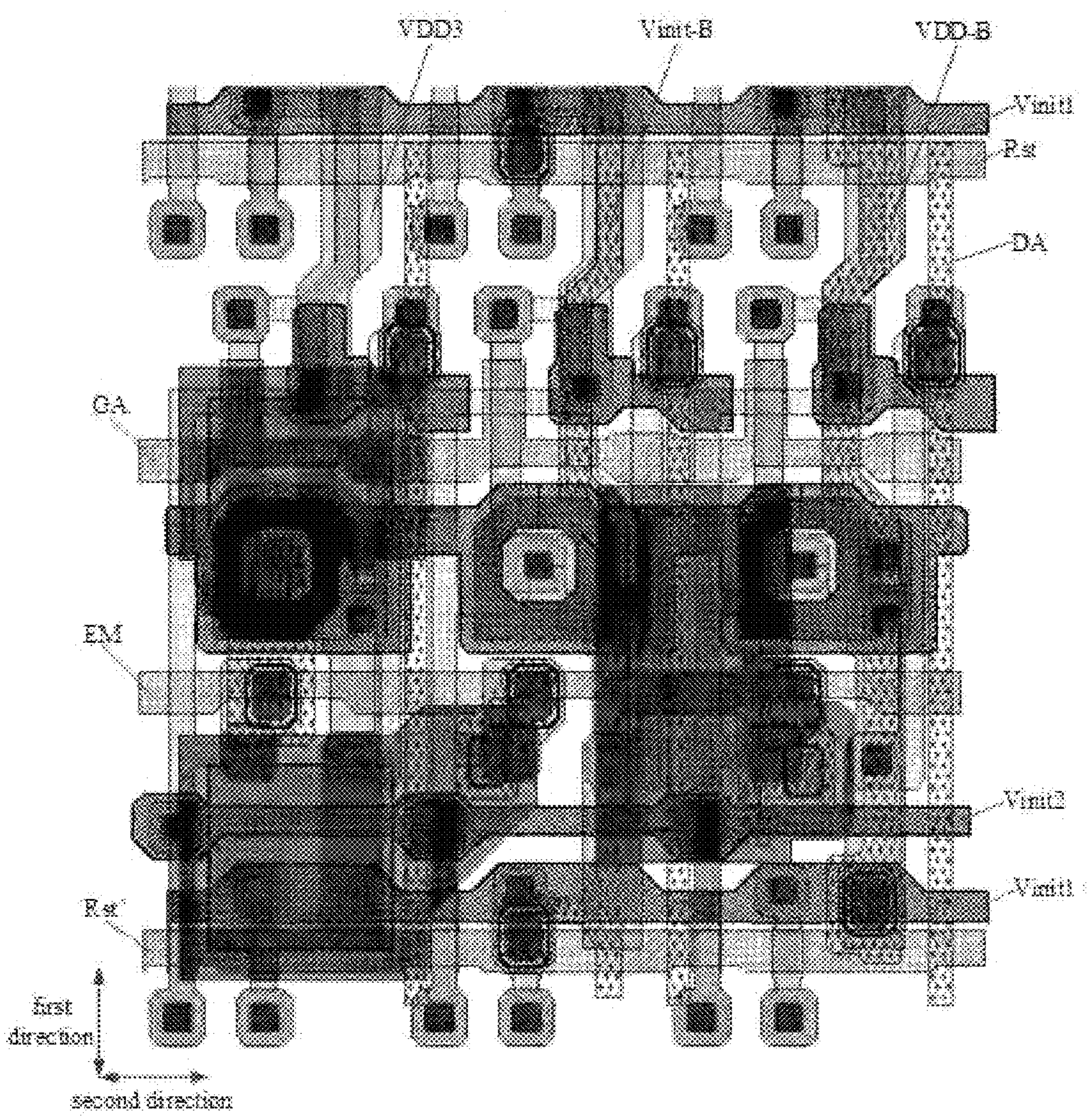
FIG. 3 is a schematic diagram of a layout of a sub-pixel driving circuit provided by an embodiment of the present disclosure.

As shown in FIG. 1 and FIG. 2, when the sub-pixel driving circuit with the above structure is in operation, each working period includes a first reset phase P1, a writing-in compensation phase P2, a second reset phase P3 and a light emitting phase P4.

In the first reset phase P1, the reset signal inputted by the reset line Rst is at an active level, the second transistor T2 is turned on, and the first initialization signal transmitted by the first initialization signal line Vinit1 is inputted to the gate electrode T3-*g* of the third transistor T3, so that the gate-source voltage Vgs maintained on the third transistor T3 in the previous frame is cleared to reset the gate electrode T3-*g* of the third transistor T3.

In the writing-in compensation phase P2, the reset signal is at an inactive level, the second transistor T2 is turned off, the gate scanning signal inputted by the gate line GA is at an active level, and the first transistor T1 and the fourth transistor T4 are controlled to be turned on, the data signal is written into the data line DA, and transmitted to the first electrode of the third transistor T3 through the fourth transistor T4, and at the same time, the first transistor T1 and the fourth transistor T4 are turned on, so that the third transistor T3 forms a diode structure, so through the cooperation of the first transistor T1, the third transistor T3 and the fourth transistor T4, the threshold voltage of the third transistor T3 is compensated. When the compensation time is long enough, the potential of the gate electrode T3-*g* finally reaches Vdata+Vth, wherein Vdata represents the voltage value of the data signal, and Vth represents the threshold voltage of the third transistor T3.

In the second reset phase P3, the gate scanning signal is at an inactive level, the first transistor T1 and the fourth transistor T4 are both turned off, and the reset signal inputted by the reset line Rst' coupled to the adjacent next row of sub-pixels is at an active level, to control the seventh transistor T7 to be turned on, input the initialization signal inputted by the second initialization signal line Vinit2 to the anode of the light emitting element EL, and control the light emitting element EL not to emit light.

In the light-emitting phase P4, the light-emitting control signal written by the light-emitting control line EM is at an active level, and the fifth transistor T5 and the sixth transistor T6 are controlled to be turned on, so that the power signal transmitted by the power supply line VDD is inputted to the first electrode of the third transistor T3. At the same time, since the gate electrode T3-*g* of the third transistor T3 is kept at Vdata+Vth, the third transistor T3 is turned on, and the gate-source voltage of the third transistor T3 is Vdata+Vth-VDD, wherein VDD is the voltage value corresponding to the power signal, the leakage current generated based on the gate-source voltage flows to the anode of the corresponding light-emitting element EL, driving the corresponding light-emitting element EL to emit light.

Embodiments of the present disclosure also provide a display device, including the display substrate provided in the above embodiments.

It should be noted that the display device can be any product or component with a display function such as a TV, a monitor, a digital photo frame, a mobile phone, a tablet computer, etc., wherein the display device also includes a flexible circuit board, a printed circuit board and a back panel.

In the display substrate provided by the above embodiment, the orthographic projection of the first pixel opening 11 on the base substrate partially overlaps the orthographic projection of the target data line among the plurality of data lines DA on the base substrate and the orthographic projection of the first pixel opening 11 on the base substrate partially overlaps the orthographic projection of the planarization compensation pattern 20 on the base substrate; so that the orthographic projection of a part of first anode pattern 51 overlapping the first pixel opening 11 on the base substrate partially overlaps the orthographic projection of the target data line in the plurality of data lines DA on the base substrate; and the orthographic projection of the part of the first anode pattern 51 overlapping the first pixel opening 11 on the base substrate partially overlaps the orthographic projection of the planarization compensation pattern 20 on the base substrate. The planarization compensation pattern 20 compensates the level difference generated by the target data line under the first anode pattern 51, so that the structure under the first anode pattern 51 can be evenly and symmetrically distributed, and the flatness of the first anode pattern 51 is improved, which effectively improves the color shift parameter of the display substrate and ensures the display quality of the display substrate.

When the display device provided by the embodiments of the present disclosure includes the above-mentioned display substrate, it also has the above-mentioned beneficial effects, which will not be repeated here.

It should be appreciated that, the expression "at a same layer" refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include a plurality of exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a base substrate, a plurality of data lines arranged on the base substrate, and a plurality of first sub-pixels arranged on the base substrate; wherein the first sub-pixel includes:

a first pixel opening, wherein an orthographic projection of the first pixel opening on the base substrate partially overlaps an orthographic projection of a target data line among the plurality of data lines on the base substrate;

a planarization compensation pattern, wherein at least part of the planarization compensation pattern extends along a first direction, an orthographic projection of the planarization compensation pattern on the base substrate at least partially overlaps the orthographic projection of the first pixel opening on the base substrate, the planarization compensation pattern and the target data line are arranged along a second direction, and the second direction intersects the first direction;

wherein the planarization compensation pattern is made of metal material;

wherein the first sub-pixel further includes a first sub-pixel driving circuit and a first anode pattern; the planarization compensation pattern is respectively coupled to the first sub-pixel driving circuit and the first anode pattern.

2. The display substrate according to claim 1, wherein the planarization compensation pattern includes a first compensation portion and a second compensation portion;

the first compensation portion is a strip structure extending along the first direction, and an orthographic projection of the first compensation portion on the base substrate partially overlaps the orthographic projection of the first pixel opening on the base substrate;

an orthographic projection of the second compensation portion on the base substrate does not overlap the orthographic projection of the first pixel opening on the base substrate.

3. The display substrate according to claim 2, wherein the orthographic projection of the first compensation portion on the base substrate is located within an orthographic projection of the first anode pattern on the base substrate;

the orthographic projection of the second compensation portion on the base substrate partially overlaps the orthographic projection of the first anode pattern on the base substrate.

4. The display substrate according to claim 1, wherein the display substrate further includes a plurality of second sub-pixels, and the second sub-pixel includes a second pixel opening;

an orthographic projection of at least part of the second pixel opening on the base substrate is located between orthographic projections of adjacent data lines on the base substrate.

5. The display substrate according to claim 4, wherein the display substrate further includes a plurality of third sub-pixels; each of the plurality of third sub-pixels includes a third pixel opening, and an orthographic projection of the third pixel opening on the base substrate is located between the orthographic projections of adjacent data lines on the base substrate;

the plurality of first sub-pixels, the plurality of second sub-pixels and the plurality of third sub-pixels are divided into a plurality of pixel units, each pixel unit includes one first sub-pixel, one second sub-pixel and one third sub-pixel; in one pixel unit, the second pixel opening and the third pixel opening are located in a same column along the first direction, and the first pixel opening is located in another column.

6. The display substrate according to claim 5, wherein each of the plurality of second sub-pixels includes a second connection portion, a second sub-pixel driving circuit and a second anode pattern, and the second connection portion is coupled to the second sub-pixel driving circuit and the second anode pattern;

the second connection portion is arranged at a same layer and made of a same material as the data line, and an orthographic projection of the second connection portion on the base substrate is located between an orthographic projection of the second pixel opening on the base substrate and an orthographic projection of the third pixel opening on the base substrate; the second pixel opening and the third pixel opening are located in a same column along the first direction.

7. The display substrate according to claim 5, wherein the display substrate further includes:

a plurality of power supply lines, at least part of the plurality of power supply lines extending along the first direction;

a plurality of power supply compensation lines, wherein the plurality of power supply compensation lines are in one-to-one correspondence with the at least part of the plurality of power supply lines, and an orthographic projection of each of the plurality of power supply compensation lines on the base substrate at least partially overlaps an orthographic projection of a corresponding power supply line on the base substrate, and each of the plurality of power supply compensation lines is coupled to the corresponding power supply line.

8. The display substrate according to claim 7, wherein the plurality of power supply lines include a plurality of first power supply lines, and the plurality of power supply compensation lines include a plurality of first power supply compensation lines, an orthographic projection of the first power supply compensation line on the base substrate at least partially overlaps an orthographic projection of a corresponding first power supply line on the base substrate, and the first power supply compensation line is coupled to the corresponding first power supply line;

the orthographic projection of the first power supply line on the base substrate does not overlap the orthographic projection of the first pixel opening on the base substrate, and the orthographic projection of the first power supply compensation line on the base substrate does not overlap the orthographic projection of the first pixel opening on the base substrate.

9. The display substrate according to claim 7, wherein the plurality of power supply lines include a plurality of second power supply lines, and the plurality of power supply compensation lines include a plurality of second power supply compensation lines, an orthographic projection of each of the plurality of second power supply compensation lines on the base substrate at least partially overlaps an orthographic projection of a corresponding second power supply line on the base substrate, and each of the plurality of second power supply compensation lines is coupled to the corresponding second power supply line;

the orthographic projection of the second power supply line on the base substrate partially overlaps the orthographic projection of the first pixel opening on the base substrate, and the orthographic projection of each of the plurality of second power supply compensation lines on the base substrate does not overlap the orthographic projection of the first pixel opening on the base substrate.

10. The display substrate according to claim 7, wherein the plurality of power supply lines include a plurality of second power supply lines, and the plurality of power supply compensation lines include a plurality of second power supply compensation lines, an orthographic projection of each of the plurality of second power supply compensation lines on the base substrate at least partially overlaps an orthographic projection of a corresponding second power supply line on the base substrate, and each of the plurality of second power supply compensation lines is coupled to the corresponding second power supply line;

the orthographic projection of the second power supply line on the base substrate partially overlaps the orthographic projection of the first pixel opening on the base substrate, and the orthographic projection of each of the plurality of second power supply compensation lines on the base substrate partially overlaps the orthographic projection of the first pixel opening on the base substrate;

at least part of the orthographic projection of the target data line on the base substrate is located between the orthographic projection of each of the plurality of second power supply compensation lines on the base substrate and the orthographic projection of the planarization compensation pattern on the base substrate.

11. The display substrate according to claim 7, wherein the plurality of power supply lines include a plurality of third power supply lines, and an orthographic projection of the third power supply line on the base substrate at least partially overlaps an orthographic projection of the second pixel opening on the base substrate; the orthographic projection of the third power supply line on the base substrate at least partially overlaps the orthographic projection of the third pixel opening on the base substrate.

12. The display substrate according to claim 7, wherein the display substrate further includes:

a plurality of first initialization signal lines, at least part of each of the plurality of first initialization signal lines extending along the second direction;

a plurality of initialization compensation patterns, at least part of each of the plurality of initialization compensation patterns extending along the first direction; adjacent first initialization signal lines being coupled to each other through at least one initialization compensation pattern.

13. The display substrate according to claim 12, wherein the plurality of power supply lines include a plurality of second power supply lines; an orthographic projection of each of the plurality of initialization compensation patterns on the base substrate at least partially overlaps an orthographic projection of each of the plurality of second power supply lines on the base substrate.

14. The display substrate according to claim 13, wherein the orthographic projection of the initialization compensation pattern on the base substrate partially overlaps the orthographic projection of the first pixel opening on the base substrate, and at least part of the orthographic projection of the target data line on the base substrate is located between the orthographic projection of the initialization compensation pattern on the base substrate and the orthographic projection of the planarization compensation pattern on the base substrate;

or wherein the orthographic projection of each of the plurality of second power supply lines on the base substrate partially overlaps the orthographic projection of the first pixel opening on the base substrate.

15. The display substrate according to claim 12, wherein the plurality of power supply lines include a plurality of first power supply lines; the orthographic projection of the initialization compensation pattern on the base substrate at least partially overlaps an orthographic projection of each of the plurality of first power supply lines on the base substrate.

16. The display substrate according to claim 13, wherein the orthographic projection of the initialization compensation pattern on the base substrate does not overlap the orthographic projection of the first pixel opening on the base substrate.

17. The display substrate according to claim 5, wherein the plurality of pixel units are divided into a plurality of columns of pixel units, and each column of pixel units include a plurality of pixel units arranged along the first direction;

the display substrate further includes a plurality of first power supply lines, a plurality of second power supply lines and a plurality of third power supply lines;

each of the plurality of first power supply lines is respectively coupled to each first sub-pixel in a corresponding row of pixel units;

each of the plurality of second power supply lines is respectively coupled to each second sub-pixel in a corresponding row of pixel units;

each of the plurality of third power supply lines is respectively coupled to each third sub-pixel in a corresponding row of pixel units;

wherein the first sub-pixel includes a blue sub-pixel, the second sub-pixel includes a red sub-pixel, and the third sub-pixel includes a green sub-pixel; each of the plurality of third power supply lines, each of the plurality of second power supply lines and each of the plurality of first power supply lines are arranged in sequence along the second direction.

18. The display substrate according to the claim 12, wherein the data line, the planarization compensation pattern, the power supply compensation line and the initialization compensation pattern are arranged at a same layer and made of a same material, the power supply line and the power compensation line are arranged in different layers;

wherein the display substrate further includes a plurality of second initialization signal lines, and the second initialization signal line includes at least part extending along the second direction; the first sub-pixel, the second sub-pixel and the third sub-pixel all include a sub-pixel driving circuit; the sub-pixel driving circuit includes a driving transistor, a first reset transistor, a second reset transistor and a light emitting element;

a first electrode of the first reset transistor is coupled to a corresponding first initialization signal line, and a second electrode of the first reset transistor is coupled to a gate electrode of the driving transistor;

a first electrode of the second reset transistor is coupled to a corresponding second initialization signal line, and a second electrode of the second reset transistor is coupled to the light emitting element.

19. A display device, including a display substrate according to claim 1.

* * * * *